United States Patent
Botez et al.

(10) Patent No.: US 7,403,552 B2
(45) Date of Patent: Jul. 22, 2008

(54) HIGH EFFICIENCY INTERSUBBAND SEMICONDUCTOR LASERS

(75) Inventors: Dan Botez, Madison, WI (US); Dapeng P. Xu, Madison, WI (US); Luke J. Mawst, Sun Prairie, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 89 days.

(21) Appl. No.: 11/276,712

(22) Filed: Mar. 10, 2006

(65) Prior Publication Data

US 2007/0248131 A1    Oct. 25, 2007

(51) Int. Cl.
*H01S 5/343* (2006.01)

(52) U.S. Cl. .................................. 372/43.01; 977/951

(58) Field of Classification Search ............. 372/43.01; 977/519

See application file for complete search history.

(56) References Cited

U.S. PATENT DOCUMENTS

| | | | |
|---|---|---|---|
| 4,023,993 A | 5/1977 | Scifres et al. | |
| 4,745,607 A | 5/1988 | Koch | |
| 4,796,274 A | 1/1989 | Akiba et al. | |
| 4,817,110 A | 3/1989 | Tokuda et al. | |
| 4,847,844 A | 7/1989 | Noda et al. | |
| 4,860,298 A | 8/1989 | Botez et al. | |
| 4,894,835 A | 1/1990 | Uomi et al. | |
| 4,958,357 A | 9/1990 | Kinoshita | |
| 4,975,923 A | 12/1990 | Buus et al. | |
| 4,985,897 A | 1/1991 | Botez et al. | |
| 5,036,522 A | 7/1991 | Tanguy et al. | |
| 5,052,016 A | 9/1991 | Mahbobzadeh et al. | |
| 5,086,430 A | 2/1992 | Kapon et al. | |
| 5,101,413 A | 3/1992 | Botez | |
| 5,159,604 A | 10/1992 | Mehuys et al. | |
| 5,170,405 A | 12/1992 | Connolly et al. | |

(Continued)

FOREIGN PATENT DOCUMENTS

WO    WO 96/08062    3/1996

(Continued)

OTHER PUBLICATIONS

Sirtori et al., "Low-loss Al-free waveguides for unipolar semiconductor lasers," Applied Physics Letters, vol. 75, p. 3911, 1999.*

(Continued)

*Primary Examiner*—Minsun Harvey
*Assistant Examiner*—Michael Carter
(74) *Attorney, Agent, or Firm*—Foley & Lardner LLP

(57) ABSTRACT

An intersubband quantum cascade laser structure includes multiple coupled laser stages, wherein each stage has a multilayer structure including an electron injector, an active region with at least one quantum well, and an electron reflector. Electrons injected from the injector into the active region at a high energy level relax to a lower energy level with the emission of a photon at, for example, mid-infrared wavelengths. The reflector reflects electrons at the higher energy level at which they were injected and transmits electrons from the lower energy level after emission of a photon. Multiple layers of semiconductor are formed on each side of the multistage structure to provide conduction across the device and to provide optical confinement of the photons emitted.

29 Claims, 16 Drawing Sheets

U.S. PATENT DOCUMENTS

| | | | |
|---|---|---|---|
| 5,208,824 A | 5/1993 | Tsang | |
| 5,222,090 A | 6/1993 | Serreze | |
| 5,241,556 A | 8/1993 | Macomber et al. | |
| 5,255,278 A | 10/1993 | Yamanaka | |
| 5,263,041 A | 11/1993 | Pankove | |
| 5,272,711 A | 12/1993 | Mawst et al. | |
| 5,272,714 A | 12/1993 | Chen et al. | |
| 5,295,150 A | 3/1994 | Vangieson et al. | |
| 5,323,405 A | 6/1994 | Kamiyama et al. | |
| 5,329,542 A | 7/1994 | Westbrook | |
| 5,345,466 A | 9/1994 | Macomber | |
| 5,347,533 A | 9/1994 | Higashi et al. | |
| 5,383,211 A | 1/1995 | Van de Walle et al. | |
| 5,389,396 A | 2/1995 | Razeghi | |
| 5,432,812 A | 7/1995 | Kurobe et al. | |
| 5,436,194 A | 7/1995 | Kondo et al. | |
| 5,452,318 A | 9/1995 | Makino et al. | |
| 5,536,085 A | 7/1996 | Li et al. | |
| 5,606,570 A | 2/1997 | Botez et al. | |
| 5,727,013 A | 3/1998 | Botez et al. | |
| 5,734,670 A | 3/1998 | Ono et al. | |
| 5,793,787 A | 8/1998 | Meyer et al. | |
| 5,818,860 A | 10/1998 | Garbuzov et al. | |
| 5,889,805 A | 3/1999 | Botez et al. | |
| 5,953,356 A | 9/1999 | Botez et al. | |
| 6,023,482 A * | 2/2000 | Capasso et al. | 372/45.01 |
| 6,028,874 A | 2/2000 | Wada et al. | |
| 6,028,875 A | 2/2000 | Knight et al. | |
| 6,127,691 A | 10/2000 | Fukunaga et al. | |
| 6,167,073 A | 12/2000 | Botez et al. | |
| 6,195,381 B1 | 2/2001 | Botez et al. | |
| 6,219,365 B1 | 4/2001 | Mawst et al. | |
| 6,256,330 B1 | 7/2001 | LaComb | |
| 6,298,077 B1 | 10/2001 | He | |
| 6,324,199 B1* | 11/2001 | Capasso et al. | 372/45.01 |
| 6,330,265 B1 | 12/2001 | Kinoshita | |
| 6,363,092 B1 | 3/2002 | Botez et al. | |
| 6,396,865 B1 | 5/2002 | Mawst et al. | |
| 6,621,842 B1 | 9/2003 | Dapkus | |
| 6,791,104 B2 | 9/2004 | Tansu et al. | |
| 6,810,053 B1 | 10/2004 | Botez et al. | |
| 6,849,866 B2 | 2/2005 | Taylor | |
| 6,907,056 B2 | 6/2005 | Botez | |
| 2004/0061102 A1 | 4/2004 | Tansu | |
| 2004/0136426 A1* | 7/2004 | Widjaja et al. | 372/46 |
| 2004/0233954 A1* | 11/2004 | Hayakawa | 372/46 |
| 2005/0173694 A1 | 8/2005 | Mawst et al. | |
| 2005/0226296 A1 | 10/2005 | Botez et al. | |

FOREIGN PATENT DOCUMENTS

| | | |
|---|---|---|
| WO | WO 01/29943 | 4/2001 |

OTHER PUBLICATIONS

H. Kogelnik, et al., "Coupled-Wave Theory of Distributed Feedback Lasers," J. Appl. Phys., vol. 43, No. 5, May 1972, pp. 2327-2335.

H. C. Casey, Jr., "Temperature dependence of threshold current density on InP-$Ga_{0.28}In_{0.72}As_{0.6}P_{0.4}$(1.3 μm) double heterostructures lasers," J. Appl. Phys., vol. 56 (7), 1984, pp. 1959-1964.

C.H. Henry, et al., "Observation of Destructive Interference in the Radiation Loss of Second-Order Distributed Feedback Lasers," IEEE J. of Quantum Electronics, vol. QE-21, No. 2, Feb. 1985, pp. 151-153.

G. Ji, et al., "Band Lineup in $GaAs_{1-x}Sb_x$/GaAs Strained-Layer Multiple Quantum Wells Grown by Molecular-Beam Epitaxy," Physical Review B, vol. 38, No. 15, Nov. 15, 1988, pp. 10571-10577.

C.G. Van De Walle, "Band Lineups and Deformation Potentials in the Model-Solid Theory," Physical Review B., vol. 39, No. 3, Jan. 15, 1989, pp. 1871-1883.

D. Botez, et al., "Resonant Optical Transmission and Coupling in Phase-Locke Waveguide Array," Appl. Phys. Lett. 54(22), May 29, 1989, pp. 2183-2185.

D. Botez, et al., "Diffraction-Limited In-Phase-Mode Operation from Uniform Array of Antiguides with Enhanced Interelement Loss," Elec. Lett. 25(19), Sep. 14, 1989, pp. 1282-1283.

D. Ahn, et al., "Optical Gain and Gain Suppression of Quantum-Well Lasers with Valence Band Mixing," IEEE Journal of Quantum Electronics, vol. 26, No. 1, Jan. 1990, pp. 13-24.

D. Boetz, et al., "Phase-Locked Arrays of Antiguides: Modal Content and Discrimination," IEEE J. of Quantum Electronics, vol. 26, No. 3, Mar. 1990, pp. 482-495.

J. Kinoshita, "Axial Profile of Grating Coupled Radiation from Second-Order DFB Lasers with Phase Shifts," IEEE Journal of Quantum Electronics, vol. 26, No. 3, Mar. 1990, pp. 407-412.

S. H. Macomber, "Nonlinear Analysis of Surface-Emitting Distributed Feedback Lasers," IEEE Journal of Quantum Electronics, vol. 26, No. 12, Dec. 1990, pp. 2065-2074.

N.W. Carlson, et al., "Mode Discrimination in Distributed Feedback Grating Surface Emitting Lasers Containing a Buried Second-Order Grating," IEEE Journal of Quantum Electronics, vol. 27, No. 6, Jun. 1991, pp. 1746-1752.

D. Botez, "High-Power Monolithic Phase-Locked Arrays of Antiguided Semiconductor Diode Lasers," IEEE Proc.-J., vol. 139, No. 1, Feb. 1992, pp. 14-23.

K. David, et al., "Basic Analysis of AR-Coated, Partly Gain-Coupled DFB Lasers: The Standing Wave Effect," IEEE J. of Quantum Electronics, vol. QE-28, No. 2, Feb. 1992, pp. 427-433.

S. Kawanaka, et al., "Strained Single Quantum Well AlGaInP Laser Diodes with an Asymmetric Waveguiding Layer," International Conference on Solid State Devices and Materials, Aug. 1, 1992, pp. 240-242.

Mawst, L.J., et al., "Design Optimization of ARROW-Type Diode Lasers," IEEE Photonics Technology Letters, vol. 4, No. 11, Nov. 1992, pp. 1204-1206.

S. F. Yu, et al., "Effect of External Reflectors on Radiation Profile of Grating Coupled Surface Emitting Lasers," IEE Proceedings J. Optoelectronics, GB, Institution of Electrical Engineers, Stevenage, vol. 140, No. 1, Feb. 1, 1993, pp. 30-38.

Y. Zou, et al., "Experimental Study of Auger Recombination, Gain, and Temperature Sensitivity of 1.5 μm Compressively Strained Semiconductor Lasers," IEEE Journal of Quantum Electronics, vol. 29, No. 6, Jun. 1993, pp. 1565-1575.

R.G. Baets, et al., "On the Distinctive Features of Gain Coupled DFB Lasers and DFB Lasers with Second Order Grating," IEEE J. of Quantum Electronics, vol. 29, No. 6, Jun. 1993, pp. 1792-1798.

D. Mehuys, et al., "5.25-W CW Near-Diffraction-Limited Tapered-Stripe Semiconductor Optical Amplifier," IEEE Photonics Technology Letters, vol. 5, No. 10, Oct. 1993, pp. 1179-1182.

D. Botez, et al., "Flat-Phasefront Fanout-Type Power Amplifier Employing Resonant-Optical-Waveguide Structures," Appl. Phys. Lett., vol. 63, No. 23, Dec. 6, 1993, pp. 3113-3115.

S. Ramanujan, et al., "Temporal Behavior of Resonant-Optical-Waveguide Phase-Locked Diode Laser Arrays," Appl. Phys. Lett., vol. 64, No. 7, Feb. 1994, pp. 827-829.

T. Namegaya, et al., "Effects of Well Number in 1.3 μm GaInAs/InP GRIN-SCH Strained-Layer Quantum-Well Lasers," IEEE Journal of Quantum Electronics, vol. 30, No. 3, Feb. 1994, pp. 578-584.

Faist, J. et al., "Quantum Cascade Laser," Science, vol. 264, pp. 553-556, Apr. 22, 1994.

CLEO/IQEC '94 Advance Program, p. 52, Abstract entitled "Uniform near-field flat-phase-front antiguided power amplifier with a three-core ARROW master oscillator," distributed prior to May 8, 1994.

E.R. Youngdale, et al., "Auger Lifetime Enhancement in $InAs-Ga_{1-x}In_xSb$ Superlattices," Appl. Phys. Lett., vol. 64, No. 23, Jun. 6, 1994, pp. 3160-3162.

Zmudzinski, C., et al., Three-Core ARROW-Type Diode Laser: Novel High-Power, Single-Mode Device, and Effective Master Oscillator for Flared Antiguided MOPAs, Technical Digest CLEO-Europe Conference, Paper CTuP3 Amsterdam, Netherlands, Aug.-Sep. 1994, pp. 169-170.

Capasso, F. et al., Conf. Dig. 14th IEEE International Semiconductor Laser Conference, pp. 71-72, Maui, Hi., Sep. 19-23, 1994.

D. P. Bour, et al., "Tensile-Strained AlGaAsP- and InGaAsP-(AlGa)$_{0.5}$In$_{0.5}$P Quantum Well Laser Diodes for TM-Mode Emission in the Wavelength Range 650 < Λ < 850 nm," IEEE Photonics Technology letters, vol. 6, No. 11, Nov. 1994, pp. 1283-1285.

Mawst, L.J., et al., "Above-Threshold Behavior of High-Power, Single-Mode Antiresonant Reflecting Optical Waveguide Diode Lasers," Appl. Phys. Lett., vol. 66, No. 1, Jan. 2, 1995, pp. 7-9.

Faist, J. et al., "Verticial Transition quantum Cascade Laser with Bragg Confined Excited State," *Appl. Phys. Lett.*, 66, pp. 538-540, Jan. 30, 1995.

Botez, D., et al., "Phase-Locked Arrays of Antiguides: Analytical Theory II," IEEE Journal Quantum Electronics, vol. 31, No. 2, Feb. 1995, pp. 244-253.

M. Sagawa, et al., "High-Power Highly-Reliable Operation of 0.98-μm InGaAs-InGaP Strain-Compensated Single-Quantum-Well Lasers with Tensile Strained InGaAsP Barriers," IEEE Journal of Selected Topics in Quantum Electronics, vol. 1, No. 2, Jun. 1995, pp. 189-195.

J.R. Meyer, et al., "Type-II Quantum-Well Lasers for the Mid-Wavelength Infrared," Appl. Phys. Lett., vol. 67, No. 6, Aug. 7, 1995, pp. 757-759.

Golster, I.V., "Single-Cladding Antiresonant Reflecting Optical Waveguide-Type Diode Laser," Optics Lett., vol. 20, No. 21, Nov. 1, 1995, pp. 2219-2221.

D. I. Babić, et al., "Room-Temperature Continuous-Wave Operation of 1.54 μm Vertical-Cavity Lasers," IEEE Photonics Technology Letters, vol. 7, No. 11, Nov. 1995, pp. 1225-1227.

Lelong, I.O., et al., "A Pulsed High-Power Quantum Well Laser using an Asymmetric Waveguide," Semiconductor Science and Technology, vol. 11, No. 4, Apr. 1, 1996, pp. 568-570.

Faist, J. et al., "Room temperature mid-infrared quantum cascade lasers," *Electron. Lett.*, vol. 32, pp. 560-561, Mar. 14, 1996.

J.I. Malin, et al., "Type II Mid-Infrared Quantum Well Lasers," App. Phys. Lett., vol. 68, No. 21, May 20, 1996, pp. 2976-2978.

T. Fukunaga, et al., "Reliable Operation of Strain-Compensated 1.06 μm InGaAs/InGaAsP/GaAs Single Quantum Well Lasers," Appl. Phys. Lett., vol. 69, No. 2, Jul. 8, 1996, pp. 248-250.

G.L. Belenky, et al., "Effect of p-Doping Profile on Performance of Strained Multi-Quantum-Well InGaAsP-InP Lasers," IEEE Journal of Quantum Electronics, vol. 32, No. 8, Aug. 1996, pp. 1450-1455.

D. Botez, et al., "66% CW wallplug efficiency from Al-free 0.98 μm-emitting diode lasers," Electronics Letters, vol. 32, No. 21, Oct. 10, 1996, pp. 2012-2013.

M. Kasraian, et al., "Metal-grating-outcoupled, surface emitting distributed-feedback diode lasers," Appl. Phys. Lett., vol. 69, No. 19, Nov. 4, 1996, pp. 2795-2797.

H. Yi, et al., "Optical losses of Al-free lasers for □=0.808 and 0.98 □m," Appl. Phys. Lett., vol. 69, No. 20, Nov. 11, 1996, pp. 2983-2985.

Faist, J. et al., "Continuous wave quantum cascade lasers in the 4-10 μm wavelength region," *SPIE*, vol. 2682, San Jose, pp. 198-204, 1996.

D. Bimberg, et al., "InGaAs-GaAs Quantum-Dot Lasers," IEEE Journal of Selected Topics in Quantum Electronics, vol. 3, No. 2, Apr. 1997, pp. 196-205.

O'Brien, S., et al., "2.2-W Continous-Wave Diffraction-Limited Monolithically Integrated Master Oscillator Power Amplifier at 854 nm," IEEE Photonics Technology Letters, vol. 9, No. 4, Apr. 1, 1997, pp. 440-442.

Buda, M., et al., "Analysis of 6-nm AlGaAs SQW Low-Confinement Laser Structures for very High-Power Operation," IEEE Journal of Selected Topics in Quantum Electronics, vol. 3, No. 2, Apr. 1997, pp. 173-179.

B. Xu, et al., "Grating Coupling for Intersubband Emission," Applied Physics Letters, US, American Institute of Physics, New York, vol. 70, No. 19, May 12, 1997, pp. 2511-2513.

Choquette, K.D., "Advanced in Selective Wet Oxidatikon of AlGaAs Alloys," IEEE Journal of Selected Topics in Quantum Electronics, vol. 3, No. 3, Jun. 1997, pp. 916-925.

M. Kondow, et al., "GaInNAs: A Novel Material for Long-Wavelength Semiconductor Lasers," IEEE Journal of Selected Topiocs in Quantum Electronics, vol. 3, No. 3, Jun. 1997, pp. 719-730.

A. Al-Muhanna, et al., "780 nm-emitting Al-Free Active Region Diode Lasers with Compressively-Strained InGaAsP Quantum Wells," Conference Proceedings, LEOS '97, Nov. 10-13, 1997, pp. 201-202.

M.A. Emanuel, et al., "High-Power InAlGaAs-GaAs Laser Diode Emitting Near 731 nm," IEEE Photonics Technology Letters, vol. 9, No. 11, Nov. 1997, pp. 1451-1453.

J. Lopez, et al., "Uniform near-field, symmetric-mode surface emission from complex-coupled 2$^{nd}$-order distributed-feedback lasers," Conference Proceedings, Leos '97, 10$^{th}$ Annual Meeting, IEEE Lasers and Electro-Optics Society 1997 Annual Meeting, vol. 1, pp. 9-10.

S. H. Macomber, et al., "Curved-Grating, Surface-Emitting DFB Lasers and Arrays," Procs. SPIE, vol. 3001, No. 42, 1997, pp. 42-54.

P.D. Floyd, et al., "Low-Threshold Laterally Oxidized GaInP-AlGaInP Quantum-Well Laser Diodes," IEEE Photonics Technology Letters, vol. 10, No. 1, Jun. 1, 1998, pp. 45-57.

A. Al-Muhanna, et al., "730-nm-Emitting Al-Free Active-Region Diode Letters with Compressively Strained InGaAsP Quantum Wells," Applied Physics Letters, vol. 72, No. 6, Feb. 9, 1998, pp. 641-643.

S. Sato, et al., "Metalorganic Chemical Vapor Deposition of GaInNAs Lattice Matched to GaAs for Long-Wavelength Laser Diodes," Journal of Crystal Growth, vol. 192, Nos. ¾, Sep. 1998, pp. 381-385.

Sirtori, C. et al., "Resonant Tunneling in Quantum Cascade Laser Structures," *IEEE J. Quantum Electron.*, vol. 34, Sep. 1998, pp. 1722-1729.

A. Al-Muhanna, et al., "High-Performance, Reliable, 730 nm-Emitting Al-Free Active Region Diode Lasers," 1998 IEEE 16$^{th}$ International Semiconductor Laser Conference, Nara, Japan, Oct. 4-8, 1998, Conference Digest, pp. 139-140.

J. Lopez, et al., "Surface-emitting, distributed-feedback diode lasers with uniform near-field intensity profile," Applied Physics Letters, vol. 73, No. 16, Oct. 19, 1998, pp. 2266-2268.

T. Anan, et la., "GaAsSb: A Novel Material for 1.3 μm VCSLs," Electronics Letters, vol. 34, No. 22, Oct. 29, 1998, pp. 2127-2129.

D.L. Huffaker, et al., "1.3 μm Room-Temperature Gaas-Based Quantum-Dot Laser," Applied Physics Letters, vol. 73, No. 18, Nov. 2, 1998, pp. 2564-2565.

J.R. Meyer, et al., "Auger Coefficients in Type-II InAs/Ga$_{1-x}$In$_x$Sb Quantum Wells," Applied Physics Letters, vol. 73, No. 20, Nov. 16, 1998, pp. 2857-2859.

Gmachl, C. et al., "Non-Cascaded Intersubband Injection Lasers at λ=7.7μm," *Appl. Phys. Lett.*, vol. 73, No. 26, Dec. 28, 1998, pp. 3830-3832.

F. Hohnsdorf, et al., "Reduced Threshold Current Densities of (GaIn)(NAs)/GaAs Single Quantum Well Lasers for Emission Wavelenths in the Range of 1.28-1.38 μm" Electronics Letters, vol. 35, No. 7, Apr. 1, 1999, pp. 571-572.

P. Bhattacharya, et al., "In(Ga)As/GaAs Self-Organized Quantum Dot Lasers: DC and Small-Signal Modulation Properties," IEEE Transactions on Electron Devices, vol. 46, No. 5, May 1999, pp. 871-883.

D. Kwon, et al., "Deep Levels in P-Type InGaAsN Lattice Matched to GaAs," Applied Physics Letters, vol. 74, No. 19, May 1999, pp. 2830-2832.

A.F. Phillips, et al., "Temperature Dependence of 1.3- and 1.5-μm Compressively Strained InGaAs(P) MQW Semiconductor Lasers," IEEE J. Select. Topics Quantum Electron., vol. 5, No. 3, May/Jun. 1999, pp. 401-412.

S. Sato, et al., "Room-Temperature Continuous-Wave Operation of 1.24 μm GaInNAs Lasers Grown by Metal-Organic Chemical Vapor Deposition," IEEE Journal of Selected Topics in Quantum Electronics, vol. 5, No. 3, May/Jun. 1999, pp. 707-710.

J. Boucart et al., "1-mW CW-RT Monolithic VCSEL at 1.55 μm," IEEE Photonics Technology Letters, vol. 11, No. 6, Jun. 1999, pp. 629-631.

F. Koyama, et al., "1.2 μm Highly Strained GaInAs/GaAs Quantum Well Lasers for Singlemode Fibre Datalink," Electronics Letters, vol. 35, No. 13, Jun. 24, 1999, pp. 1079-1081.

J. Lopez, et al., "Single-mode, single-lobe operation of surface-emitting, second-order distributed feedback lasers," Applied Physics Letters, AIP, USA, vol. 75, No. 7, Aug. 16, 1999, pp. 885-887.

D. Schlenker, et al., "1-17-μm highly strained GaInAs-GaAs quantum-well lasers," IEEE Photon. Technol. Lett., vol. 11(8), Aug. 1999, pp. 946-948.

P. Dowd, et al., "Long Wavelength (1.3 and 1.5 μm) Photoluminescense fromInGaAs/GaPAsSb Quantum Wells Grown on GaAs," Applied Physics Letters, vol. 75, No. 9, Aug. 30, 1999, pp. 1267-1269.

S. Sato, et al., "1.21 μm Continuous-Wave Operation of Highly Strained GaInAs Quantum Well Lasers on GaAs Substrates," Jpn. J. Appl. Phys., vol. 38, Sep. 15, 1999, pp. 990-992.

K. Mukai, et al., "1.3 μm CW Lasing of InGaAs-GaAs Quantum Dots at Room Temperature with a Threshhold Current of 8 mA," IEEE Photonics Technology Letters, vol. 11, No. 10, Oct. 1999, pp. 1205-1207.

E.P. O'Reilly, et al., "k-P model of Ordered $GaN_xAs_{1-x}$," Physica Status Solidi (b), vol. 216, No. 1, Nov. 1, 1999, pp. 131-134.

W. Choi, et al., "1.2-μm GaAsP/InGaAs Strain Compensated Single-Quantum-Well Diode Laser on GaAs Using Metal-Organic Chemical Vapor Deposition," IEEE Photonics Technology Letters, vol. 11, No. 12, Dec. 1999, pp. 1572-1574.

M.R. Gokhale, et al., "Low-Threshold Current, High-Efficiency 1.3-μm Wavelength Aluminum-Free InGaAsN-Based Quantum-Well Lasers," IEEE Photonics Technology Letters, vol. 12, No. 2, Feb. 2000, pp. 131-133.

I.K. Han, et al., "Dependence of the Light-Current Characteristics of 1.55 □m Broad-Area Lasers on Different p-doping Profiles," IEEE Photonics Technology Letters, vol. 12, No. 3, Mar. 2000, pp. 251-253.

C.W. Coldren, et al., "1200 nm GaAs-Based Vertical Cavity Lasers Employing GaInNAs Multiquantum Well Active Regions," Electronics Letters, vol. 36, No. 11, May 25, 2000, pp. 951-952.

P. Bhattacharya, et al., "High-Speed Modulation and Switching Characteristics of In(Ga)As-Al(Ga)As Self-Organized Quantum-Dot Lasers," IEEE Journal of Selected Topics in Quantum Electronics, vol. 6, No. 3, May/Jun. 2000, pp. 426-438.

C.F. Hsu, et al., "Intersubband Quantum-Box Semiconductor Lasers," *IEEE J. Quantum Electron.*, vol. 6, May/Jun. 2000, pp. 491-503.

S. Sato, "Low Threshold and High Characteristics Temperature 1.3 μm Range GaInNAs Lasers Grown by Metalorganic Chemical Vapor Deposition," Jpn. J. Appl. Phys., vol. 39, Jun. 2000, pp. 3403-3405.

A. Stinz, et al., "Low-Threshold Current Density 1.3-μm InAs Quantum-Dot Lasers with the Dots-in-a-Well (DWELL) Structure," IEEE Photonics Technology Letters, vol. 12, No. 6, Jun. 2000, pp. 591-593.

B. Borchert, et al., "Static and Dynamic Characteristics of 1.29-μm GaInNAs Ridge-Waveguide Laser Diodes," IEEE Photonics Technology Letters, vol. 12, No. 6, Jun. 2000, pp. 597-599.

O. Blum, et al., "Characteristics of GaAsSb Single-Quantum-Well-Lasers Emitting Near 1.3 μm," IEEE Photonics Technology letters, vol. 12, No. 7, Jul. 2000, pp. 771-773.

M. Yamada, et al., "Low-Threshold Operation of 1.3-μm GaAsSb Quantum-Well Lasers Directly Grown on GaAs Substrates," IEEE Photonics Technology Letters, vol. 12, No. 7, Jul. 2000, pp. 774-776.

K.D. Choquette, et al., "Room Temperature Continous Wave InGaAsN Quantum Well Vertical-Cavity Lasers Emitting at 1.3 μm," Electronics Letters, vol. 36, No. 16, Aug. 3, 2000, pp. 1388-1390.

S. Ryu, et al., "Low Threshold Current Density GaAsSb Quantum Well (QW) Lasers Grown by Metal Organic Chemical Vapour Deposition on GaAs Substrates," Electronic Letters, vol. 36, No. 16, Aug. 3, 2000, pp. 1387-1388.

E. Hall, et al., "Room-Temperature, CW Operation of Lattice-Matched Long-Wavelength VCSELs," Electronics Letters, vol. 36, No. 17, Aug. 17, 2000, pp. 1465-1467.

W. Braun, et al., "Strained InGaAs/GaPAsSb Heterostructures Grown on GaAs (001) for Optoelectronic Applications in the 1100-1550 nm Range," Journal of Applied Physics, vol. 88, No. 5, Sep. 1, 2000, pp. 3004-3014.

G. Liu, et al., "Optical Gain of Strained GaAsSb/GAAs Quantum-Well Lasers: A Self-Consistent Approach," Journal of Applied Physics, vol. 88, No. 10, Nov. 15, 2000, pp. 5554-5561.

J.S. Harris, Jr., "Tunable Long-Wavelength Vertical-Cavity Lasers: The Engine of Next Generation Optical Networks?" IEEE J. Select. Topics Quantum Electron., vol. 6, No. 6, Nov./Dec. 2000, pp. 1145-1160.

F. Quochi, et al., "Room Temperature Operation of GaAsSb/GaAs Quantum Well VCSELs at 1.29 μm," Electronics Letters, vol. 36, No. 25, Dec. 7, 2000, pp. 2075-2076.

Barbieri, S. et al., "Design Strategies for GaAs-based unipolar lasers: optimum injector-active region coupling via resonant tunneling," *Appl. Phys. Lett.*, vol. 78, Jan. 15, 2001, pp. 282-284.

R. Fehse, et al., "Insights into Carrier Recombination Processes in 1.3 μm GaInNAs-Based Semiconductor Lasers Attained Using High Pressure," Electronics Letters, vol. 37, No. 2, Jan. 18, 2001, pp. 92-93.

N. Tansu, et al., "High-Performance Strain-Compensated InGaAs-GaAsP-GaAs ($\lambda$=1.17 μm) Quantum-Well Diode Lasers," IEEE Photonics Technology Letters, vol. 13, No. 3, Mar. 2001, pp. 179-181.

M. O. Fischer, et al., "Room-temperature operation of GaInAsN-GaAs laser diodes in the 1.5-μm range," IEEE J. Select. Topic Quantum Electronic., vol. 7 (2), Mar.-Apr. 2001, pp. 149-151.

T. Anan, et al., "Continuous-Wave Operation of 1.30 μm GaAsSb/GAAS VCSELs," Electronics Letters, vol. 37, No. 9, Apr. 26, 2001, pp. 566-567.

Page, H. et al., "300 K operation of a GaAs-based quantum-cascade laser at $\lambda \approx 9$ μm," Appl. Phys. Lett., vol. 79, No. 22, May 28, 2001, pp. 3529-3531.

M. Kawaguchi, et al., "Lasing characteristics of low threshold GaInNAs lasers grown by Metalorganic Chemical vapor Deposition", Jpn. J. Appl. Phys., vol. 40, Jul. 2001, pp. 744-746.

W.W. Chow, et al., "Contributions to the Large Blue Emission Shift in a GaAsSb Type-II Laser," IEEE Journal of Quantum Electronics, vol. 37, No. 9, Sep. 9, 2001, pp. 1178-1182.

S. Tomic, et al., "A Theoretical Analysis of the Radiative Current and its Dependence on pressure in GaInNAs 1.3 μm Lasers," IEEE LEOS 2001, San Diego, CA, Nov. 2001, pp. 328-329.

S.R. Kurtz, et al., "MOCVD-Grown, 1.3 μm InGaAsN Multiple Quantum Well Lasers Incorporating GAAsP Strain-Compensated Layers," Proceedings of SPIE, vol. 4287, 2001, pp. 170-175.

J. Wu, et al., "Effect of Band Anticrossing on the Optical Transitions on $GAAs_{1-x}N_x$/GaAs Multiple Quantum Wells," Physical Review B, vol. 64, 2001, pp. 1-4.

Beck, M. et al., "Continuous Wave Operation of a Mid-Infrared Semiconductor Laser at Room Temperautre," *Science*, vol. 295, pp. 301-305, Jan. 11, 2002.

W. Ha, et al., "High-Efficiency Multiple Quantum Well GaInNAs/GaNAs Ridge-Waveguide Diode Lasers," Proceedings of SPIE vol. 4651, Jan. 2002, pp. 42-48.

Yang, Q. K. et al., "Improvement of $\lambda \approx 5$ μm quantum cascade lasers by blocking barriers," *Appl. Phys. Lett.*, vol. 80, No. 12, Mar. 25, 2002, pp. 2048-2050.

N. Tansu, et al., "Low-Threshold Strain-Compensated InGaAs(N) ($\lambda$=1.19-1.31 μm) Quantum Well Lasers," IEEE Photon. Technol. Lett., vol. 14(4), Apr. 2002, pp. 444-446.

T. Takeuchi, et al., "Low threshold 1.2 μm InGaAs quantum well lasers grown under low As/III ratio," Appl. Phys. Lett., vol. 80(14), Apr. 8, 2002, pp. 2445-2447.

Sirtori, C. et al., "GaAs-AlGaAs Quantum Cascade Lasers: Physics, Technology and Prospects," *IEEE J. Quantum Electron.*, vol. 38, Jun. 2002, pp. 547-558.

N. Tansu, et al., "Temperature Analysis and Characteristics of Highly Strained InGaAs-GaAsP-GaAs ($\lambda$>1.17 μm) Quantum-Well Lasers," IEEE Transactions on Quantum Electronics, vol. 38, No. 6, Jan. 2002, pp. 640-651.

R. Fehse, et al., "A Quantitative Study of Radiative, Auger, and Defect Related Recombination Processes in 1.3-μm GaInNAs-Based Quantum-Well Lasers," IEEE Select. J. Quantum Electron., 8(4), 801, Jul./Aug. 2002.

V. Gambin, et al. "GaInNAsSb for 1.3-1.6 μm long wavelength lasers grown by MBE," IEEE J. Quantum. Electron, vol. 8, Jul./Aug. 2002, pp. 795-800 or InGaAs-GaAsSb type-II QWs.

N. Tansu, et al., "Temperature Sensitivity of 1300-nm InGaAsN Quantum-Well Lasers," IEEE Photon. Technol. Lett., vol. 14(8), Aug. 2002, pp. 1052-1054.

J.J. Lee, et al., "Asymmetric Broad Waveguide Diode Lasers (□=980 nm) of Large Equivalent Transverse Spot Size and Low Temperature Sensitivity," IEEE Photonics Technology Letters, vol. 14, No. 8, Aug. 2002, pp. 1046-1048.

N. Tansu, et al., "Low-Threshold-Current-Density 1300-nm Dilute-Nitride Quantum Well Lasers," Appl. Phys. Lett, vol. 81(14), Sep. 2002, pp. 2523-2525.

H. Cao, et al., "Characterization of MOCVD-grown InNAs/GaAs Quantum Wells", IEEE/OSA Conference on Lasers and ElectroOptics (CLEO), paper CFG2, 2002, p. 653.

T. Takeuchi, et al., "1.3μm InGaAsN Vertical Cavity Surface Emitting Lasers Grown by MOCVD," Electronics Letters, vol. 38(23), Nov. 7, 2002, pp. 1438-1440.

N. Tansu, et al., "The Role of Hole-Leakage in 1300-nm InGaAsN Quantum Well Lasers," Appl. Phys. Lett., vol. 82(10), Mar. 2003, pp. 1500-1502.

N. Tansu, et al., "High-Performance and High-Temperature Continuous-Wave-Operation 1300-nm InGaAsN Quantum Well Lasers by Organometallic Vapor Phase Epitaxy," Appl. Phys. Lett., vol. 83(1), Jul. 2003, pp. 18-20.

N. Tansu, et al., "Experimental Evidence of Carrier Leakage in InGaAsN Quantum Well Lasers," Appl. Phys. Lett., vol. 83(11), Sep. 2003.

I. Vurgaftman, et al., "Band parameters for nitrogen-containing semiconductors," J. Appl. Phys. 94, 3675, Sep. 15, 2003.

N. Tansu, et al., "Design Analysis of 1550-nm GaAsSb-(In)GaAsN Type-II Quantum-Well Lasers Active Regions," IEEE J. of Quantum Elec., vol. 39, No. 10, Oct. 2003, pp. 1205-1210.

I. Vurgaftman, et al., "(In) GaAsN-based type-II 'W' quantum-well lasers for emission at $\lambda=1.55\mu m$," Appl. Phys. Lett., vol. 83, No. 14, Oct. 6, 2003, pp. 2742-2744.

Xu, D.P., et al., "Room-temperature, mid-infrared ($\lambda$ =4.7 μm) electroluminescence from single-stage intersubband GaAs-based edge emitters," Tech. Digest 2004 CLEO/IQEC Conference, paper CMR2, San Francisco, Ca., May 16-21, 2004.

Botez, D. et al., "Intersubband Quantum-Box Semiconductor Lasers," Proc. International Workshop on Quantum Cascade Lasers, Jan. 4-8, 2004, Seville, Spain.

* cited by examiner

| Compound | Fraction* / ** | |
|---|---|---|
| GaAs | 1 | 50 |
| GaAsP | 0.67 | 35 |
| GaAs | 1 | 40 |
| AlGaAs | 0.3 | 15 |
| GaAs | 1 | 47 |
| AlGaAs | 0.3 | 15 |
| GaAs | 1 | 38 |
| AlGaAs | 0.3 | 16 |
| GaAs | 1 | 33 |
| AlGaAs | 0.7 | 20 |
| AlGaAs | 0.3 | 20 |
| GaAs | 1 | 42 |
| InGaAs | 0.7 | 24 |
| AlGaAs | 0.3 | 13 |
| InGaAs | 0.7 | 35 |
| AlGaAs | 0.3 | 20 |
| InGaAs | 0.7 | 19 |
| GaAsP | 0.67 | 29 |
| InGaAs | 0.7 | 18 |
| GaAsP | 0.67 | 26 |
| InGaAs | 0.7 | 18 |
| GaAsP | 0.67 | 24 |
| InGaAs | 0.7 | 17 |
| GaAsP | 0.67 | 22 |
| InGaAs | 0.7 | 17 |
| GaAsP | 0.67 | 21 |

* If the compound is $Al_{1-x}Ga_xAs$ or $In_{1-x}Ga_xAs$
** If the compound is $GaAs_xP_{1-x}$

FIG. 2

| | Ga* or As** Fraction | Thickness (Å) |
|---|---|---|
| GaAs | 1 | 50 |
| GaAsP | 0.62 | 35 |
| GaAs | 1 | 42 |
| AlGaAs | 0.3 | 15 |
| GaAs | 1 | 47 |
| AlGaAs | 0.3 | 15 |
| GaAs | 1 | 40 |
| AlGaAs | 0.3 | 16 |
| GaAs | 1 | 30 |
| GaAsP | 0.62 | 40 |
| AlGaAs | 0.3 | 20 |
| GaAs | 1 | 28 |
| InGaAs | 0.6 | 30 |
| AlGaAs | 0.3 | 13 |
| InGaAs | 0.6 | 36 |
| AlGaAs | 0.3 | 20 |
| InGaAs | 0.7 | 22 |
| GaAsP | 0.5 | 20 |
| InGaAs | 0.7 | 20 |
| GaAsP | 0.5 | 20 |
| InGaAs | 0.7 | 19 |
| GaAsP | 0.5 | 20 |
| InGaAs | 0.7 | 19 |
| GaAsP | 0.5 | 20 |
| InGaAs | 0.7 | 18 |
| GaAsP | 0.5 | 20 |

* If the compound is $Al_{1-x}Ga_xAs$ or $In_{1-x}Ga_xAs$
** If the compound is $GaAs_xP_{1-x}$

FIG. 5 (b)

| | Ga* or As** Fraction | Thickness (Å) |
|---|---|---|
| GaAs | 1.00 | 50 |
| AlGaAs | 1.00 | 50 |
| AlGaAs^ | 0.30 | 13 |
| GaAsP^ | 0.60 | 14 |
| InGaAs^ | 0.88 | 15 |
| GaAsP^ | 0.60 | 15 |
| AlGaAs^ | 0.30 | 13 |
| GaAsP^ | 0.60 | 13 |
| InGaAs^ | 0.88 | 13 |
| GaAsP | 0.60 | 13 |
| AlGaAs | 0.30 | 15 |
| AlGaAs | 1.00 | 15 |
| GaAsP | 0.60 | 25 |
| AlGaAs | 0.30 | 22 |
| InGaAs | 0.70 | 19 |
| GaAsP | 0.60 | 20 |
| InGaAs | 0.70 | 19 |
| GaAsP | 0.60 | 20 |
| InGaAs | 0.70 | 19 |
| GaAsP | 0.60 | 20 |
| InGaAs | 0.70 | 19 |
| GaAsP | 0.60 | 20 |
| InGaAs | 0.70 | 19 |
| GaAsP | 0.60 | 20 |

^ These layers were doped at a concentration of 4×10$^{17}$ cm$^{-3}$. The other layers were not intentionally doped, or were doped at a low concentration (e.g., no greater than 4×10$^{16}$ cm$^{-3}$).

FIG. 6 (b)

* If the compound is Al$_{1-x}$Ga$_x$As or In$_{1-x}$Ga$_x$As
** If the compound is GaAs$_x$P.

| | Ga* or As** Fraction | Thickness (Å) |
|---|---|---|
| GaAs | 1 | 18 |
| GaAsP | 0.6 | 27 |
| AlGaAs | 1 | 17 |
| AlGaAs | 0.25 | 13 |
| AlGaAs | 1 | 38 |
| AlGaAs | 0.25 | 20 |
| AlGaAs | 1 | 35 |
| AlGaAs | 0.7 | 13 |
| AlGaAs | 0.25 | 13 |
| AlGaAs | 1 | 23 |
| AlGaAs | 0.25 | 11 |
| InGaAs | 0.8 | 53 |
| AlGaAs | 0.5 | 11 |
| InGaAs | 0.8 | 49 |
| AlGaAs | 0.3 | 20 |
| InGaAs | 0.8 | 30 |
| GaAsP | 0.6 | 25 |
| InGaAs | 0.85 | 20 |
| GaAsP | 0.6 | 25 |
| InGaAs | 0.9 | 20 |
| GaAsP | 0.6 | 25 |
| InGaAs | 0.95 | 20 |
| GaAsP | 0.6 | 25 |
| InGaAs | 1 | 20 |
| GaAsP | 0.6 | 25 |

FIG. 7 (b)

| Layer | Ga* or As** Fraction | Thickness (Å) |
|---|---|---|
| GaAs | 1 | 50 |
| GaAsP | 0.5 | 50 |
| GaAs | 1. | 42 |
| AlGaAs | 0.3 | 15 |
| GaAsP | 0.6 | 20 |
| GaAs | 1 | 25 |
| AlGaAs | 0.3 | 15 |
| GaAsP | 0.6 | 24 |
| GaAs | 1 | 25 |
| AlGaAs | 0.3 | 16 |
| GaAs | 1 | 25 |
| GaAsP | 0.6 | 45 |
| AlGaAs | 0.3 | 20 |
| GaAsP | 0.6 | 50 |
| InGaAs | 0.5 | 28 |
| AlGaAs | 0.3 | 13 |
| InGaAs | 0.5 | 28 |
| AlGaAs | 0.3 | 20 |
| InGaAs | 0.6 | 28 |
| GaAsP | 0.5 | 11 |
| InGaAs | 0.7 | 18 |
| GaAsP | 0.5 | 12 |
| InGaAs | 0.7 | 20 |
| GaAsP | 0.5 | 13 |
| InGaAs | 0.8 | 18 |
| GaAsP | 0.6 | 14 |
| InGaAs | 0.8 | 18 |
| GaAsP | 0.6 | 15 |
| GaAs | 1 | 100 |

FIG. 10(b)

| | N Fraction | Thickness (Å) |
|---|---|---|
| GaAs | 0 | 50 |
| $Al_{0.8}Ga_{0.2}As$ | 0 | 15 |
| $GaAs_{0.6}P_{0.4}$ | 0 | 43 |
| $Al_{0.8}Ga_{0.2}As$ | 0 | 16 |
| GaAs | 0 | 20 |
| $Al_{0.8}Ga_{0.2}As$ | 0 | 16 |
| GaAs | 0 | 19 |
| $Al_{0.8}Ga_{0.2}As$ | 0 | 15 |
| GaAs | 0 | 18 |
| $Al_{0.45}Ga_{0.55}As$ | 0 | 30 |
| $Al_{0.8}Ga_{0.2}As$ | 0 | 20 |
| $GaAs_{0.6}P_{0.4}$ | 0 | 20 |
| $In_{0.4}Ga_{0.6}As_{0.995}N_{0.005}$ | 0.005 | 33 |
| $Al_{0.8}Ga_{0.2}As$ | 0 | 15 |
| $In_{0.4}Ga_{0.6}As_{0.995}N_{0.005}$ | 0.005 | 36 |
| $Al_{0.8}Ga_{0.2}As$ | 0 | 20 |
| $GaAs_{0.985}N_{0.015}$ | 0.015 | 24 |
| $Al_{0.4}Ga_{0.6}As$ | 0 | 14 |
| $GaAs_{0.985}N_{0.015}$ | 0.015 | 22 |
| $Al_{0.4}Ga_{0.6}As$ | 0 | 14 |
| $GaAs_{0.985}N_{0.015}$ | 0.015 | 21 |
| $Al_{0.4}Ga_{0.6}As$ | 0 | 14 |
| $GaAs_{0.985}N_{0.015}$ | 0.015 | 20 |
| $Al_{0.4}Ga_{0.6}As$ | 0 | 14 |
| $GaAs_{0.985}N_{0.015}$ | 0.015 | 19 |
| $Al_{0.4}Ga_{0.6}As$ | 0 | 14 |
| $GaAs_{0.985}N_{0.015}$ | 0.015 | 19 |
| $Al_{0.4}Ga_{0.6}As$ | 0 | 14 |
| $GaAs_{0.985}N_{0.015}$ | 0.015 | 18 |
| $Al_{0.4}Ga_{0.6}As$ | 0 | 14 |

FIG. 11 (b)

HIGH EFFICIENCY INTERSUBBAND SEMICONDUCTOR LASERS

FIELD OF THE INVENTION

This invention pertains generally to the field of semiconductor lasers and, particularly, to quantum cascade lasers.

BACKGROUND OF THE INVENTION

Semiconductor lasers are formed of multiple layers of semiconductor materials. The conventional semiconductor diode laser typically includes an n-type layer, a p-type layer and an undoped layered active structure between them such that when the diode is forward biased electrons and holes recombine within the active structure with the resulting emission of light. The layers adjacent to the active structure typically have a lower index of refraction than the active structure and form cladding layers that confine the emitted light to the active structure and sometimes to adjacent layers. Semiconductor lasers may be constructed to be either edge-emitting or surface-emitting.

A semiconductor laser that emits photons as electrons from within a given quantized energy band, wherein the electrons relax within that band by decaying from one quantized energy level to another, rather than emitting photons from the recombination of electrons and holes, has been reported. Since the radiative transitions are very inefficient the electrons are recycled by using multiple stages. See, J. Faist, F. Capasso, D. L. Sivco, C. Sirtori, A. L. Hutchinson, and A. Y. Cho, *Science*, Vol. 264, pp. 553, et seq., 1994. This device, referred to as a quantum cascade laser (QCL), is the first reported implementation of an intersubband semiconductor laser. The basic light-generation mechanism for this device involves the use of 25 active regions composed of 3 quantum wells each. Injection by resonant tunneling occurs in the energy level (level 3) of the first, narrow quantum well. A radiative transition occurs from level 3, in the first well, to level 2, the upper state of the doublet made by two coupled quantum wells. Quick phonon-assisted relaxation from level 2 to 1 insures that level 2 is depleted so that population inversion between levels 3 and 2 can be maintained, Electrons from level 1 then tunnel through the passive region between active regions, which is designed such that, under bias, it allows such tunneling to act as injection into the next active region. Further developments of this type of device are reported in F. Capasso, J. Faist, D. L. Sivco, C. Sirtori, A. L; Hutchinson, S. N. G. Chu, and A. Y. Cho, Conf. Dig. 14th IEEE International Semiconductor Laser Conference, pp. 71-72, Maui, Hi. (Sep. 19-23, 1994); J. Faist, F. Capasso, C. Sirtori, D. L. Sivco, A. L. Hutchinson, and A. Y. Cho, Appl. Phys. Lett., 66, 538, (1995); J. Faist, F. Capasso, C. Sirtori, D. L. Sivco, A. L. Hutchinson, S. N. G. Chu, and A. Y. Cho, "Continuous wave quantum cascade lasers in the 4-10 µm wavelength region," SPIE, Vol. 2682, San Jose, pp. 198-204, 1996; and J. Faist, F. Capasso, D. L. Sivco, C. Sirtori, A. L. Hutchinson, and A. Y, Cho, "Room temperature mid-infrared quantum cascade lasers," Electron. Lett., Vol. 32, pp. 560-561, 1996. More recently continuous wave (CW) operation has been achieved at 300 K, but with very low power conversion efficiency (<2.5%) and only at wavelengths between 4.8 and 9 µm. See M. Beck, D. Hofstetter, T. Aellen, J. Faist, U. Oesterle, M. Ilegems, E. Gini, and H. Melchior, *Science*, Vol. 295, pp. 301-305, 2002; and A. Evans, J. S. Yu, S. Slivken, and M. Razeghi, "Continuous-wave operation at λ~4.8 µm quantum-cascade lasers at room temperature," *Appl. Phys. Lett.*, Vol. 85, pp. 2166-2168, 2004. Despite this rapid improvement in the performance capabilities of GaInAs/InP-based quantum cascade lasers, it is unlikely that they will ever be able to operate CW at 300 K with high power-conversion efficiency (>10%) at wavelengths of interest in the mid-infrared (3 to 5 µm) and far-infrared (8 to 12 µm) wavelength ranges due primarily to the fact that their electro-optical characteristics are extremely temperature sensitive near and at 300 K. One approach to obtaining efficient room temperature CW operation of intersubband semiconductor lasers in the mid-infrared (3 to 5 µm) and far-infrared (8 to 12 µm) ranges involves the use of two-dimensional arrays of quantum boxes, with each quantum box incorporating a single-stage, intersubband transition structure. See C-F Hsu, J-S. O, P. Zory and D. Botez, "Intersubband Quantum-Box Semiconductor Lasers," IEEE J. Select. Topics Quantum Electron., Vol. 6, 2000, pp. 491-503; U.S. Pat. No. 5,953,356 entitled "Intersubband Quantum Box Semiconductor Laser."

Room temperature intersubband emission has been reported for single-stage, unipolar devices only from InP-based structures at wavelengths as short as 7.7 µm. C. Gmachl, et al. "; Non-Cascaded Intersubband Injection Lasers at λ=7.7 µm" Appl. Phys. Lett., Vol. 73, 1998, pp 3822-3830. For 30- to 40-stages, GaAs—AlGaAs quantum cascade lasers at room temperature, intersubband emission wavelengths shorter than 8 µm cannot be achieved, since at higher transmission energies, the active-region upper level is apparently depopulated via resonant tunneling between the X valleys of the surrounding AlGaAs barriers. C. Sirtori, et al., "(GaAs—AlGaAs Quantum Cascade Lasers: Physics, Technology and Prospects," IEEE J, Quantum Electron., Vol. 38, 2002, pp. 547-558. Optimization studies of GaAs-based devices have shown that for thin barriers between the injector region and the active region, two effects occur which cause significant decreases in the upper level injection efficiency: (1) a diagonal radiative transition from injector-region ground level, g, to an active region lower level, and (2) severe carrier leakage from the level g to the continuum. S. Barbieri, et al., "Design Strategies for GaAs-based unipolar lasers: optimum injector-active region coupling via resonant tunneling,"Appl, Phys. Lett., Vol. 78, 2001, pp. 282-284. In addition to these limitations, quantum cascade lasers are conventionally formed of three regions, a superlattice injector, an active region, and a superlattice reflector/transmitter, functioning as an electron Bragg reflector, which is identical in structure to the superlattice injector. This fact severely restricts the device design. Furthermore, for such devices the necessary impurity doping in the superlattice injectors causes a significant increase in the room-temperature threshold-current density due to excited carriers from the doped injector region that fill the lower levels of prior active regions, thus reducing the population inversion. This phenomenon, called carrier backfilling, is the main cause for the extreme temperature sensitivity of the devices characteristics which leads to thermal runaway and very low power-conversion efficiencies.

SUMMARY OF THE INVENTION

In accordance with the present invention, semiconductor lasers are formed to provide highly efficient emission at selected wavelengths, which may lie in the mid- to far-infrared range. Such semiconductor lasers constructed to emit in the infrared range provide efficient conversion of electrical energy to electromagnetic energy at infrared wavelengths, and thus may be used as compact, efficient infrared sources for a variety of applications, such as spectroscopy, measurement of gases and liquids for process control and pollution monitoring, infrared signaling, and the like.

In the quantum cascade lasers of the present invention, the optical gain required for laser action is provided by the radiative transition of electrons within a given energy band from a higher to a lower energy level. These transitions take place in a plurality of coupled laser stages, each of which has an internal active region in which electrons make a transition from a higher to a lower energy level with the consequent emission of photons at a wavelength related to the change in energy. Depending on the particular materials and dimensions of the laser stages, a range of emission wavelengths of may be achieved using the present devices. For example, in some embodiments emission wavelengths from 3 to 5 µm (e.g., 4.8 µm) may be produced. In other embodiments emission wavelengths from 6 to 12 (e.g., 8 to 12 µm) may be produced.

Each stage of the quantum cascade laser (QCL) of the present invention has a multiple layer structure that includes an electron injector, an active region coupled to the electron injector, and an electron reflector coupled to the active region, opposite the electron injector. As used herein, the phrase "coupled to" is used broadly to indicate that at least some electrons are able to pass from one section (e.g., electron injector active region or electron reflector) of the structure to another. In some instances the coupled sections will be directly adjacent.

In sharp contrast to conventional QCL devices the QCL of the present invention has the electron injector separated from the electron reflector. The electron injector, which may be comprised of multiple semiconductor layers, has two minibands, the lower of which allows for the transmission of electrons into an upper energy level of the active region. The active region includes at least one quantum well, having associated therewith an upper energy level and a lower energy level, characterized in that electrons injected into the upper energy level from the miniband of the preceding electron injector undergo a radiative transition to emit a photon as they decay from the upper energy level to the lower energy level. The electron reflector, which may be comprised of multiple semiconductor layers, has a minigap that acts as a reflector for electrons in the upper energy level of the preceding active region and a lower miniband that acts as a transmitter of electrons that have decayed to the lower energy level of the preceding active region into the miniband of an adjacent electron injector. It should be understood that the electrons may undergo one or more phonon-assisted transitions to energy levels lower than the "lower energy level" of the active region subsequent to their initial radiative decay to that lower energy level. Thus, the electrons referred to in the phrase "electrons that have decayed to the lower energy level" include electrons that have undergone phonon-assisted transitions to lower energy levels subsequent to a radiative transition from the upper to the lower energy level in the active region. For typical semiconductor material systems, each one of the laser stages will have transverse dimensions no greater than about 800 angstroms (Å) and preferably no greater than about 600 (Å). Typically, the quantum cascade lasers will include at least ten adjacent laser stages (e.g., 25 or more stages).

In the quantum cascade lasers the electron reflector of a first stage (the "up-stream stage") is adjacent to the electron injector of a the following stage (the "down-stream stage"). This, design is advantageous because it allows for increased separation between the injector of the down-stream stage and the active region of the up-stream stage, resulting in significantly decreased electron backfilling and substantially improved power-conversion efficiency. In addition, this design allows the structures of the electron injector and the electron reflector to be optimized independently for improved performance.

The active region of each stage has multiple semiconductor layers, including at least one, and desirably more than one, quantum well defined by a semiconductor well layer sandwiched between two semiconductor barrier layers. The quantum wells in the active region are desirably "deep" quantum wells. A deep quantum well in an active region is defined as a quantum well having a well bottom that is lower in energy than the bottoms of the quantum wells in the adjacent electron injector.

The quantum wells of the active region and/or the injection barrier of the electron injector may be composite structures. For example, a composite injector barrier layer may comprise two semiconductor layers, the second semiconductor layer having a higher bandgap than the first. The second semiconductor layer of the composite injector barrier being sufficiently thin to prevent scattering to the X valleys during tunneling. A composite quantum well may comprise two adjacent semiconductor well layers, the second semiconductor well layer providing a deeper well than the first. This combination of a composite injector barrier layer and a composite well layer provides for good wavefunction overlap between the $E_3$ and $E_2$ levels in the active region and poor wavefunction overlap between the ground state of the electron-injector miniband and the $E_2$ level in the active region, resulting in improved toweling efficiency.

By way of illustration only, the active region of a laser stage may include a quantum well (or multiple wells, if desired) formed of a layer of InGaAs between layers of AlGaAs, the electron injector may be formed of a superlattice composed of alternating layers of GaAs and AlGaAs, and the reflector may be a Bragg mirror formed from a superlattice composed of alternating layers of GaAsP and InGaAs.

The semiconductor structure of the quantum cascade laser of the invention includes layers on each side of the plurality of adjacent laser stages (the "laser core") to provide conduction across the structure, and a transverse optical waveguide composed of optical-confinement layers and cladding layers on either side of the laser core to provide optical wvaveguiding of the photons generated in the structure. Electrodes may be formed on the top and bottom surfaces of the multistage structure to allow connection to an external circuit to provide current flow across the structure. For example, for structures based on GaAs material systems, layers adjacent to the multistage structure and the cladding layers may be GaAs layers. Alternatively, the cladding layers may be AlGaAs layers.

The semiconductor laser of the invention can be formed of material systems, and on substrates, such as gallium arsenide (GaAs), that are compatible with further semiconductor circuit processing. The semiconductor lasers may be formed on the (100) crystal face of GaAs, but may also be grown on other miscut faces, including the (111) face and the (411) face.

A variety of material systems in addition to GaAs, such an indium phosphide (InP), may also be utilized which can similarly be formed to have appropriate intersubband transitions.

The semiconductor lasers of the invention are also well suited to being produced using production techniques compatible with a large scale processing, such as metal-organic chemical vapor deposition (MOCVD).

Further objects, features and advantages of the invention will be apparent from the following detailed description when taken in conjunction with the accompanying drawings.

BRIEF DESCRIPTION OF THE DRAWINGS

FIG. 2 is a simplified cross-sectional view of the multilayer structure of one stage of the quantum cascade laser of FIG. 1.

DETAILED DESCRIPTION OF THE INVENTION

Figure 1:
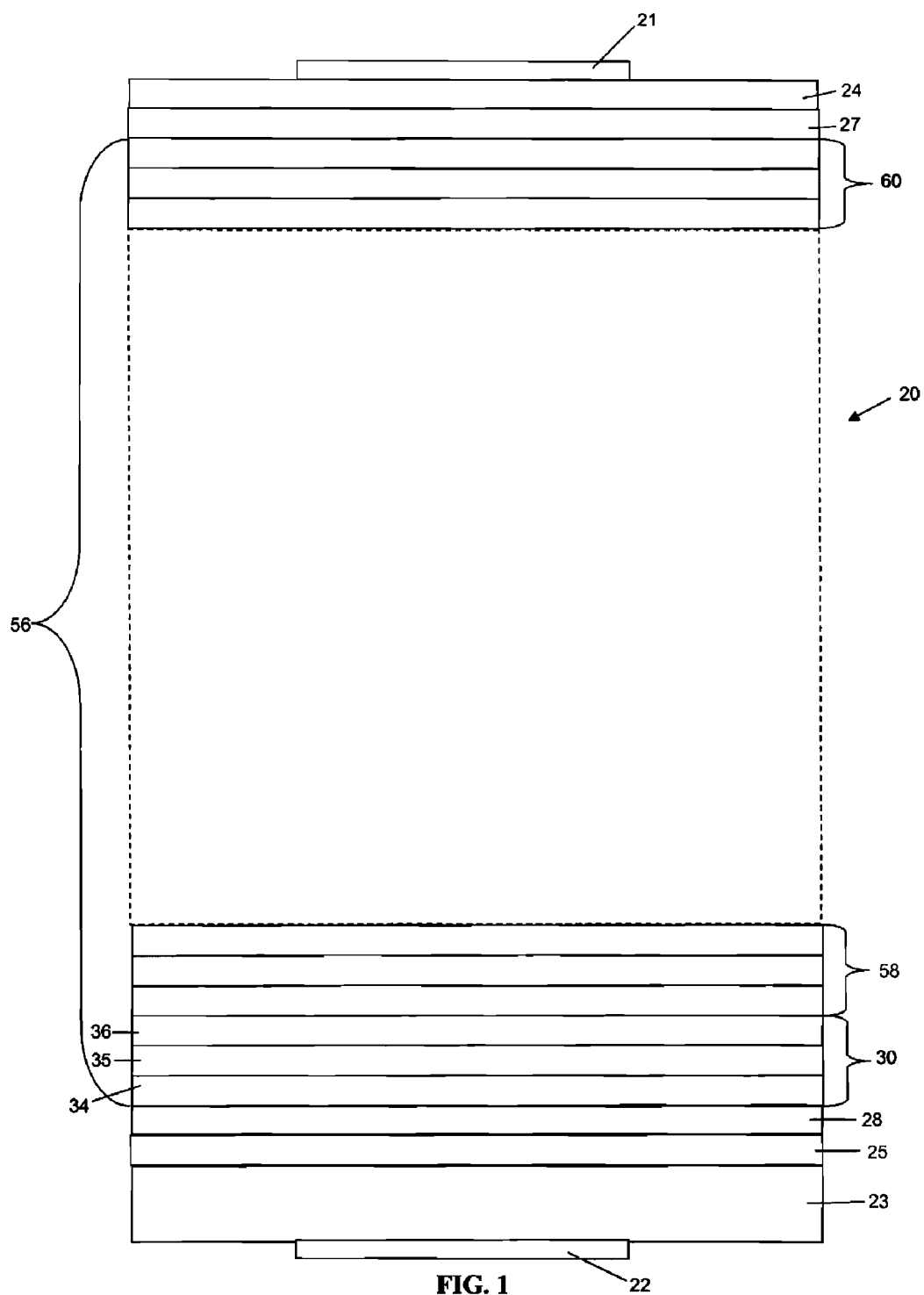
FIG. 1 is a simplified cross-sectional view through a quantum cascade laser in accordance with the present invention.

With reference to the drawings, an example of an implementation of the intersubband quantum cascade laser of the present invention is illustrated generally at 20 in FIG. 1, a simplified cross-sectional view through the multi-layer semiconductor structure. For purposes of illustration, the semiconductor laser structure 20 is shown with a top electrode layer 21 and a bottom electrode layer 22, both of which may be formed on the outer faces of the semiconductor structure of, e.g., conducting metal such as aluminum, gold, etc. The structure further includes top and bottom cladding layers 24 and 25, respectively, for example, formed of n-type semiconductor, Adjacent the layers 24 and 25 are semiconductor layers 27 and 28, respectively, which are selected to provide appropriate electrical conduction across them and to have an appropriate index of refraction so as to cooperate with the layers 24 and 25 to provide optical confinement of the emitted light to the region between the layers 24 and 25.

Figure 3:
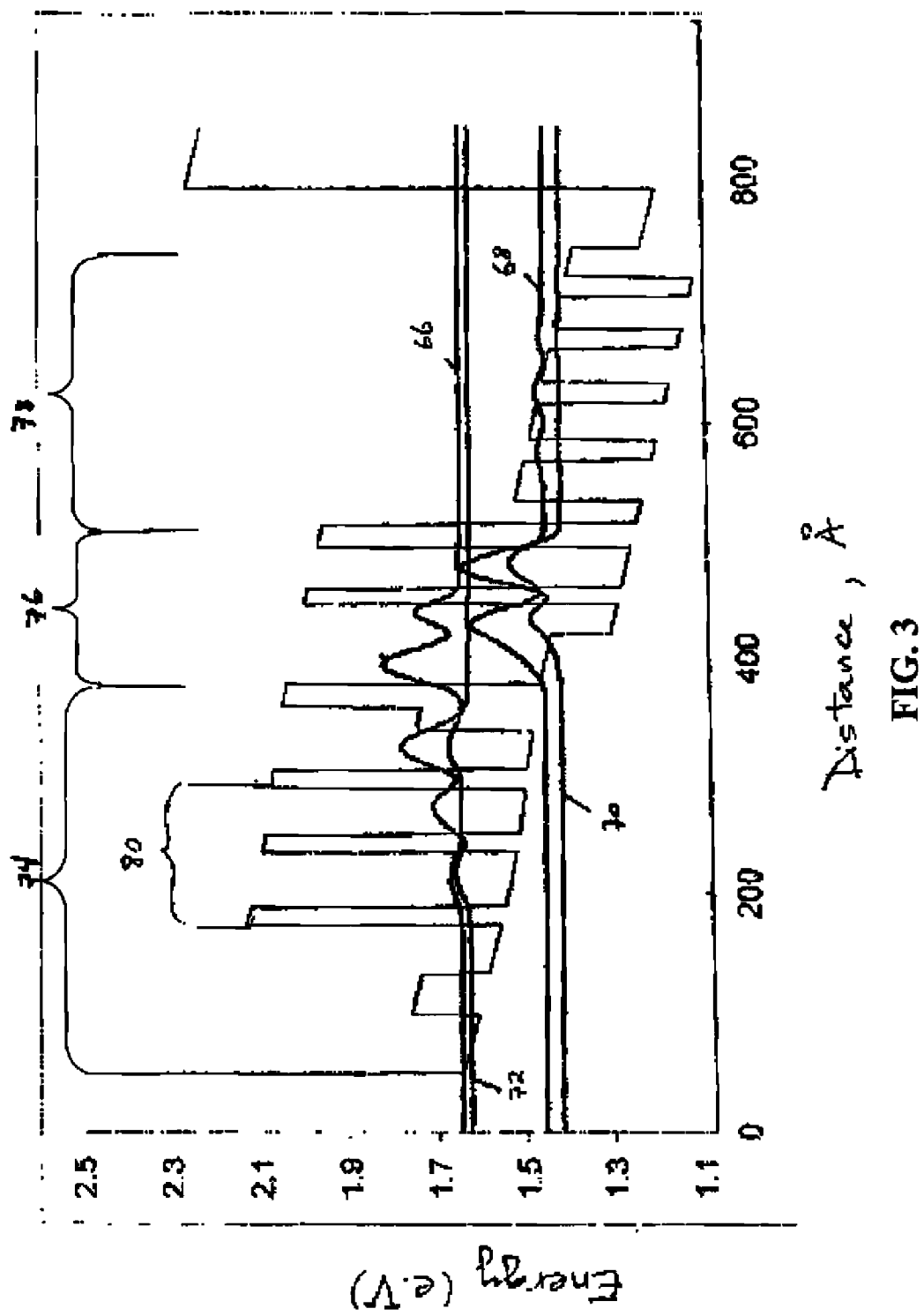
FIG. 3 shows the conduction band energy diagram for the multilayer structure of FIG. 2.

A cross-sectional view of a particular stage 30 of a quantum cascade laser, with exemplary compositions (first column) and thicknesses (second column) of the various layers, is shown in FIG. 2. This stage comprises multiple layers of semiconductor material forming an electron injector 34, an active region 35, and a distributed Bragg mirror 36 functioning as an electron reflector and transmitter. A conduction band energy diagram for the electron injector 74, the active region 76 and the electron reflector 78 of stage 30 is illustrated in FIG. 3, which also shows the moduli squared of the wavefunctions for energy level $E_3$ 66, energy level $E_2$ 68, energy level $E_1$ 70 and the g state 72, the ground state of the electron injector miniband.

As shown in FIG. 2, the active region 35 of the laser stage 30 may be composed of InGaAs well layers 38, 40 under biaxial compression, and AlGaAs barrier layers 44, 46 which are lattice-matched to a GaAs substrate. In the embodiment shown in FIG. 2, a composite injection barrier 48 and a composite quantum well 50 are used to optimize the electron tunneling injection efficiency from the electron injector 34 into the active region 35.

In order to achieve efficient lasing for each laser stage in a quantum cascade laser, it is desirable to optimize the tunneling injection efficiency from the ground state of the miniband of the electron injector and the upper energy level ($E_3$) of the active region to close to 100% (e.g., about 90-95%), and minimize incoherent tunneling from the ground state of the miniband of the injector to the lower energy level, $E_2$, of the active region. In accordance with these principles, the active region 35 of FIG. 2 achieves efficient lasing by employing a composite quantum well 50 and a composite injector barrier 48 adjacent to the composite quantum well 50. The composite injector barrier 48 comprises two adjacent semiconductor layers 42, 52 the second semiconductor layer having a higher bandgap than the first. The second semiconductor layer of the composite injector barrier is sufficiently thin to prevent scattering to the X valleys during tunneling. Similarly, the composite quantum well 50 comprises two adjacent semiconductor layers 38, 547 the second semiconductor layer providing a deeper well bottom than the first. This combination of a composite injector barrier and a composite quantum well provides for good wavefunction overlap between the $E_3$ and $E_2$ levels in the active region and poor wavefunction overlap between the ground state of the electron injector miniband and $E_2$ in the active region. As a result, tunneling efficiencies of about 95%, or even higher may be achieved. In the illustrative laser stage depicted in FIGS. 2 and 3 the composite injector barrier is composed of a first layer of $Al_{0.3}Ga_{0.7}As$ and a second layer of $Al_{0.7}Ga_{0.3}As$ and the composite quantum well is composed of a first layer of GaAs and a second layer of InGaAs.

Figure 4:
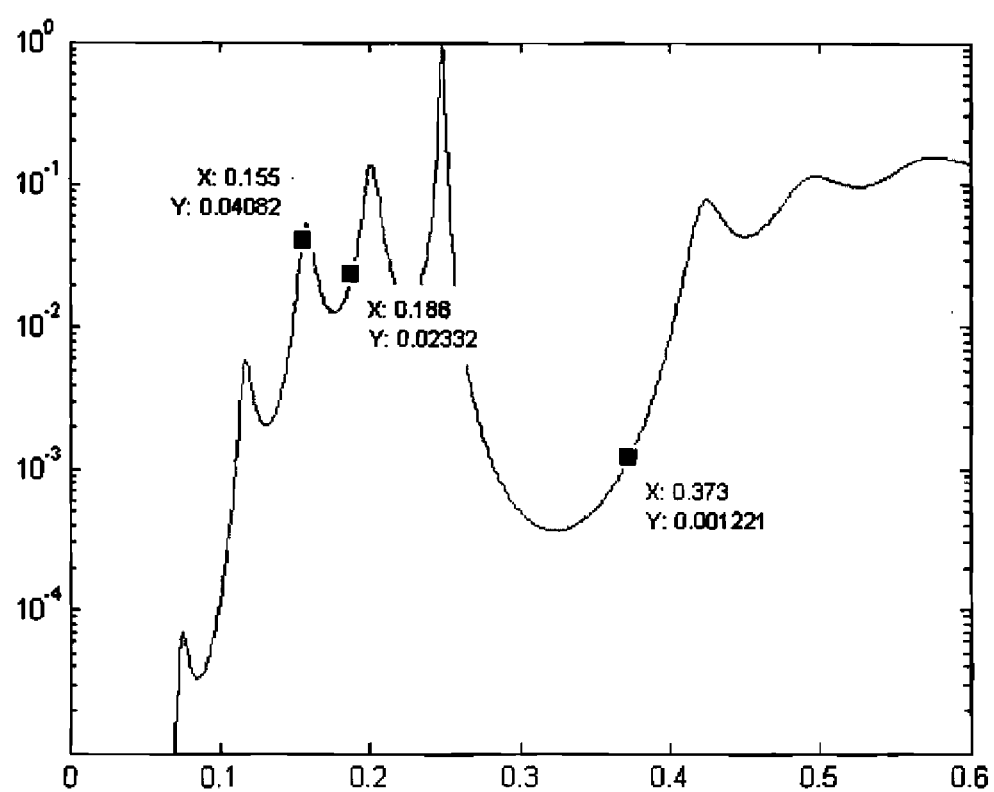
FIG. 4 is a diagram showing the calculated transmission probability as a function of electron energy for the electron injector of the laser stage shown in FIG. 2. This figure clearly shows a miniband (high transmission, $>5\times10^{-1}$) for electrons in the $E_1$ energy level of the active region, and a minigap (low transmission, $\approx 10^{-3}$) for electrons in the $E_3$ energy level of the active region.

The electron injector 34, allows for high injection efficiency into the upper energy level of the active region. In the illustrative embodiment shown in FIG. 2, the electron injector 34 is a superlattice composed of alternating layers of AlGaAs and GaAs. The electron injector is n-type doped ($4\times10^{17}$ cm$^{-3}$) over the range 80 indicated in FIG. 3, and corresponds to a donor sheet density of $4.6\times10^{11}$ cm$^{-2}$ in the superlattice section. FIG. 4 shows the calculated transmission probability as a function of electron energy for the electron injector of the laser stage shown in FIG. 2. This figure clearly shows a miniband (high transmission, ~$10^{-1}$) for electrons in the $E_1$ energy level of the active region, and a minigap (low transmission, ≈$10^{-3}$) for electrons in the $E_3$ energy level of the active region.

The electron reflector 36, a superlattice formed of multiple alternating layers of GaAsP and InGaAs, acts as a Bragg reflector for electrons being reflected at energy level $E_3$ from the active region, and acts as a resonant tunneling structure for electrons escaping from energy level $E_1$ into the electron injector of an adjacent stage. Similar Bragg reflectors are used for the embodiments shown in FIGS. 5 and 6, discussed below.

In some embodiments of the laser stages, including the embodiment depicted in FIG. 21 the quantum wells in the active region are compressively strained. In such embodiments, strain compensation is desirable. In previous semiconductor lasers, strain compensation was achieved by incorporating tensilely-strained barrier layers between compressively-strained well layers. FIGS. 5(a) and 6(a) show the conduction band energy diagrams for alternative designs that provide strain-compensation for an active region having compressively strained quantum wells. These figures show the composition and thicknesses of the semiconductor layers in some illustrative embodiments.

Figure 5:
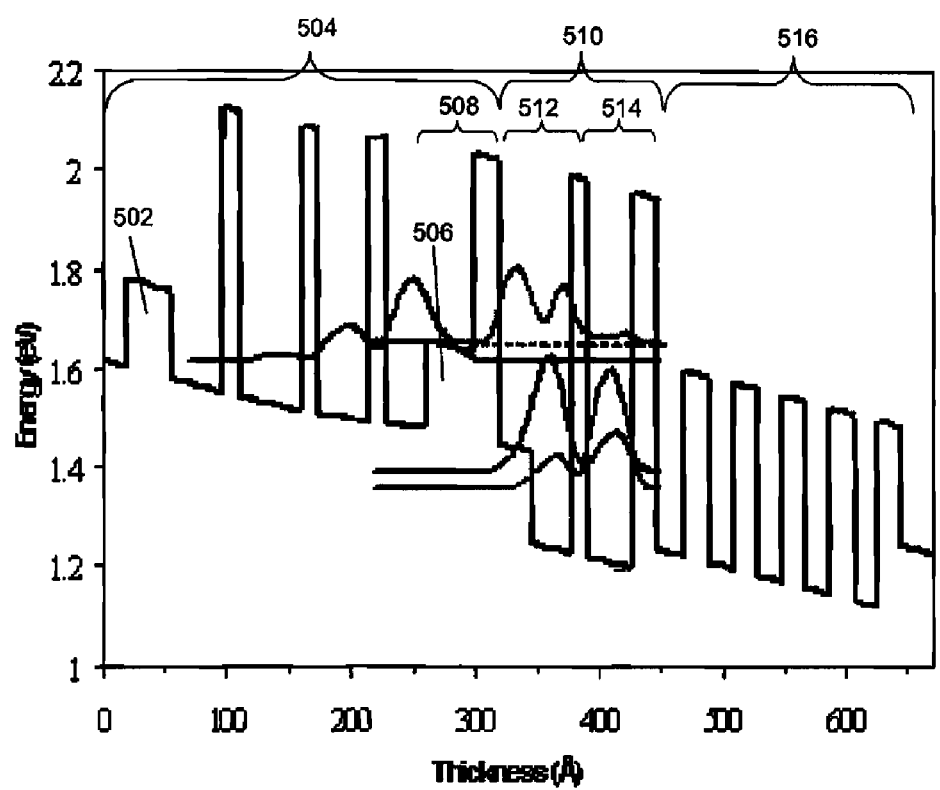
FIG. 5(a) shows the conduction band energy diagram for a multilayer structure for a laser stage having a single-phonon resonance structure and incorporating an electron injector with a composite injection barrier that includes a tensilely-strained layer to provide strain-compensation for an active layer with compressively strained quantum wells.
FIG. 5(b) shows a simplified cross-sectional view through the multilayer structure of FIG. 5(a).

Like the structure shown in FIG. 3, the structure shown in FIG. 5 is a single-phonon resonance structure. In FIG. 5 strain compensation is provided by using a tensilely-strained layer 502 as the first barrier layer of the electron injector 504 along with a tensilely-strained layer 506 as the first layer of the composite injection barrier 508. Tensilely-strained layer 506 acts as an intermediate-height barrier layer that decouples the wavefunctions of the ground state of the electron injector miniband and a lower energy level of the active region, but still allows good coupling between the ground state of the electron injector miniband and an upper energy level of the active region. In the particular embodiment shown in FIG. 5, tensilely-strained layers 502 and 506 are GaAs$_{0.62}$P$_{0.38}$ layers, the other layers making up electron injector 504 are alternating layer of GaAs and Al$_{0.7}$Ga$_{0.3}$As. The active region 510 is composed of a first composite quantum well 512 having a GaAs layer adjacent to a In$_{0.4}$Ga$_{0.6}$As layer and a second quantum well 514 of In$_{0.4}$Ga$_{0.6}$As sandwiched between layers of Al$_{0.7}$Ga$_{0.3}$As. The electron reflector 516 is a superlattice of alternating layers of In$_{0.3}$Ga$_{0.7}$As and GaAs$_{0.5}$P$_{0.5}$. The structure of FIG. 5 is designed for emission at 4.8 μm. The optical-confinement layers, cladding layers and substrate may be as shown in FIG. 1. The tables in FIG. 5(b) show the composition and thickness of each layer represented in the conduction band energy diagram of FIG. 5(a). In the tables, the middle column indicates the Ga fraction for Al$_{1-x}$Ga$_x$As or In$_{1-x}$Ga$_x$As or the As fraction for GaAs$_x$P$_{1-x}$. The far right column in the tables provides the thickness (in Å) of each layer.

Figure 6:
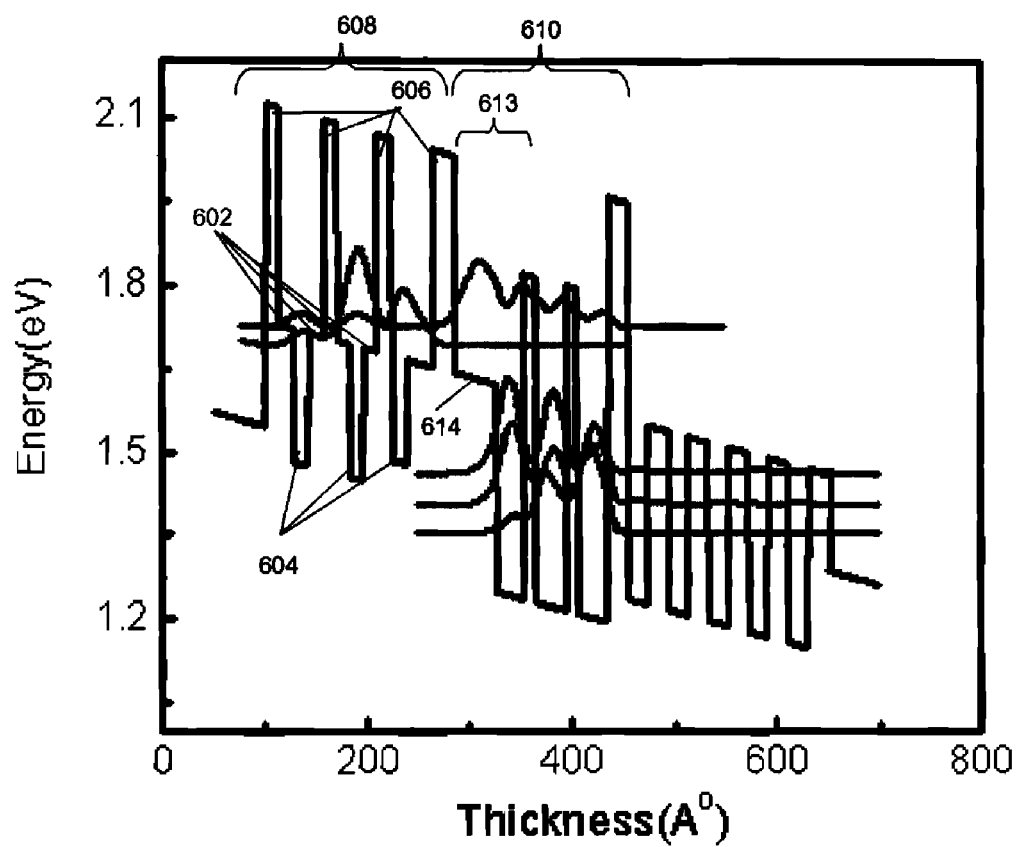
FIG. 6(a) shows the conduction band energy diagram for a laser stage having a double-phonon resonance structure and incorporating an electron injector that includes tensilely-strained barrier layers to provide strain-compensation for an active layer with compressively strained quantum wells.
FIG. 6(b) is a simplified cross-sectional view of the multilayer structure of the stage of the quantum cascade laser of FIG. 6(a).

FIGS. 6(a) and (b) show the conduction band energy diagram and a simplified cross-sectional view of a device with a double-phonon resonance structure having strain-compensation. In this device, strain compensation is provided by incorporating semiconductor layers that are in tensile strain 602 between well layers 604 and their associated barrier layers 606 in the superlattice of the electron injector 608 (i.e., outside of the active region) of the laser stage. This, structure has three deep quantum wells in the active region 610. The first quantum well is a composite quantum well 613 that includes a layer of tensilely-strained semiconductor 614. Layer 614 also serves to decouple the wavefunctions of the ground state of the electron injector miniband and a lower energy level of the active region (level $E_3$ in FIG. 6), but still allows good coupling between the wavefunctions of the ground state of the electron injector miniband and an upper energy level of the active region (level $E_4$ in FIG. 6). In the illustrative embodiment shown in FIG. 6, tensilely-strained layers 602 are GaAsP (GaAs$_{0.60}$P$_{0.40}$), well layers 604 are GaAs or InGaAs (In$_{0.12}$Ga$_{0.88}$As) layers and the barrier layers 606 are AlGaAs layers. The optical-confinement layers, cladding layers and substrate may be as shown in FIG. 1.

Figure 7:
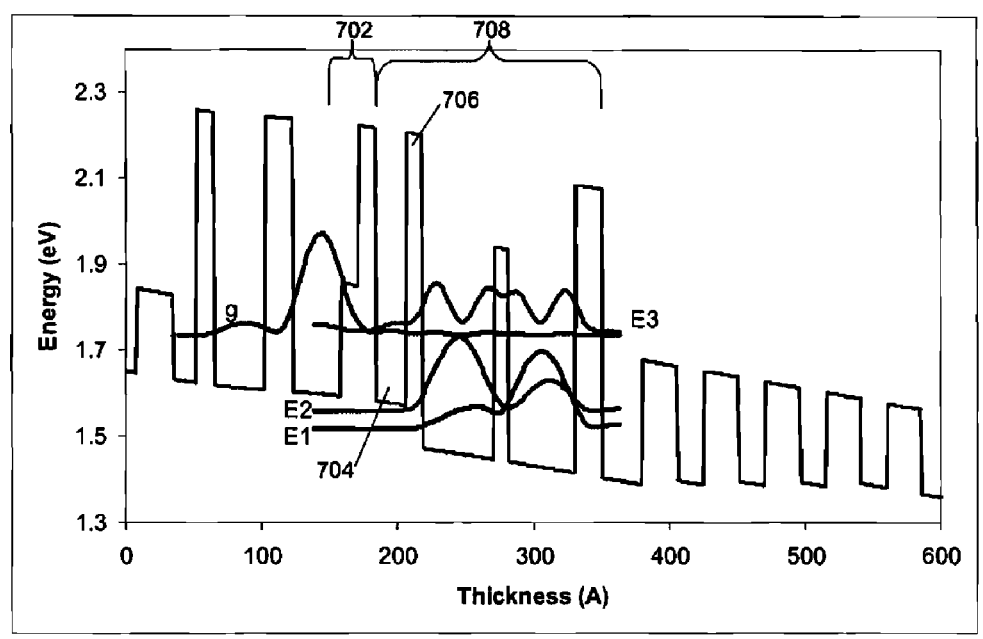
FIG. 7(a) shows the conduction band energy diagram for a multilayer structure for a laser stage having an active region with a thin well layer and a thin barrier layer in the active region for improved tunneling injection efficiency.
FIG. 7(b) is a simplified cross-sectional view through the multilayer structure of FIG. 7(a).

FIGS. 7(a) and (b) show the conduction band energy diagram and a simplified cross-sectional view an alternative device design for which close to 100% tunneling injection efficiency from the ground state of the injector to the upper energy level of the active region is realized by using a composite injection barrier 702 and a thin well layer 704 (e.g. having a thickness of no more than about 3 nm, and desirably no more than about 2.4 nm) and a thin barrier layer 706 (e.g. having a thickness of no more than about 2 nm and desirably no more than about 1.5 nm) in the active region 708 adjacent to the composite injection barrier 702.

In the laser stage shown in FIG. 2, carrier tunneling through the X valley of the Al$_{0.7}$Ga$_{0.3}$As barrier layer 46 of active region 35 may lead to carrier leakage. Therefore, in some embodiments of the present semiconductor lasers it is desirable to include an exit barrier in the active region that prevents such carrier leakage. This exit barrier may be composed of a layer of direct bandgap material, as such materials have X valleys situated in energy much above the Γ valley. AlInP is an example of a direct bandgap material that may be used as an exit barrier layer in the active region. Alternatively, the exit barrier layer may be a composite exit barrier composed of a layer of indirect bandgap material adjacent to one or two layers of direct bandgap material, wherein the Γ valleys of the direct bandgap materials have a higher conduction band energy than the X valley of the indirect bandgap material. One non-limiting example of such a composite exit barrier is a layer of Al$_{0.40}$Ga$_{0.60}$As placed before a layer of AlAs. Another example is a layer of AlAs sandwiched between two layers of Al$_{0.40}$Ga$_{0.60}$As.

It is noted that for prior QCL devices, a single multi-quantum well (MQW) structure is used as both an electron injector and an electron reflector (Bragg mirror). In the present invention, because the electron injector and the electron reflector are separate elements, the electron injector 34 and the electron reflector 36 can be designed independently for improved efficiency. For example the electron reflector may be composed of undoped semiconductor layers, thus significantly reducing electron backfilling into the preceding active region.

The following summarizes the actions of the single-phonon resonance structure of FIGS. 1-3:
(a) Electrons, after being accelerated under bias across the electron injector 34, are injected into energy level $E_3$ 66 of the active region 35 via resonant tunneling. They cannot escape to the continuum, because, for a properly designed reflector 36, the transmission is practically zero for the energy level $E_3$.
(b) Electrons from the $E_3$ 66 level undergo radiative decay to level $E_2$ 68 and subsequently undergo a non-radiative transition (i.e., phonon-assisted transition) to $E_1$ 70.
(c) Electrons from $E_1$ 70 tunnel through the miniband in the adjacent electron reflector 36 and then into the miniband of the electron injector of a downstream laser stage.

In the illustrative laser stage of FIG. 2, the GaAs/AlGaAs superlattice of the electron injector was designed for tunneling to level n=3 of the active region at a field of 60 kV/cm. The double quantum well of the active region was designed for a vertical radiative transition of 190 meV (i.e., λ=6.5 μm). The energy splitting at resonance between the g level (of the electron injector) and the n=3 state is about 6.1 meV, which leads to strong coupling.

The following summarizes the actions of the double-phonon resonance structure of FIG. 6:
(a) Electrons, after being accelerated under bias across the electron injector 608, are injected into energy level $E_4$ 620 of the active region 610 via resonant tunneling. They cannot escape to the continuum, because, for a properly designed reflector 612, the transmission is practically zero for the energy level $E_4$.
(b) Electrons from the $E_4$ 620 level undergo radiative decay to level $E_3$ 622 and subsequently undergo a non-radiative transition (i.e., phonon-assisted transition) to $E_2$ 624.
(c) Electrons from $E_2$ 624 undergo a non-radiative transition (i.e., phonon-assisted transition) to $E_1$ 626.
(d) Electrons from $E_2$ 624 and $E_1$ 626 tunnel through the miniband in the adjacent electron reflector 612 and then into the miniband of the electron injector of a downstream laser stage.

In the illustrative laser stage of FIG. 6, the (In)GaAs/AlGaAs superlattice with GaAsP strain-compensation layers of the electron injector was designed for tunneling to level n=4 of the active region at a field of 60 kV/cm. The double quantum well of the active region was designed for a vertical radiative transition of 263 mev (i.e., λ=4.72 μm).

In some embodiments, the active region includes at least one deep quantum well that includes a semiconductor well layer having a high indium content. For example, such deep quantum wells may comprise a semiconductor well layer containing at least 30 atomic percent indium. This includes semiconductor well layers comprising at least about 50 percent indium (e.g., about 50 to about 60 atomic percent indium). For example the at least one deep quantum well may include a well layer of $In_{0.5}Ga_{0.5}As$. This well layer may be disposed between barrier layers composed of, for example, AlGaAs (e.g., $Al_{0.7}Ga_{0.3}As$). Due to the increased strain in the high indium content well, structures that contain the high indium content semiconductors should be grown at lower temperatures (e.g., ≦550° C.). Alternatively, the at least one deep quantum well may include a semiconductor well layer comprising a nitrogen-containing semiconductor, such as InGaAsN (e.g., $In_{0.4}Ga_{0.6}As_{0.995}N_{0.005}$). This well layer may be disposed between two barrier layers of, for example, AlGaAs (e.g., $Al_{0.8}Ga_{0.2}As$) or GaAsP.

The high-indium content deep quantum wells and the nitrogen-containing deep quantum wells, described above, are under compressive strain. Therefore it is desirable to provide strain compensation. One way to achieve strain compensation is by employing an electron reflector composed of a superlattice with tensilely-strained quantum wells adjacent to and down-stream from active regions that incorporate such deep quantum wells. One example of a suitable strain-compensating superlattice includes alternating layers of AlGaAs and GaAsN. Another example of a suitable strain-compensating superlattice includes alternating layers of InGaAs and GaAsP.

Figure 10:
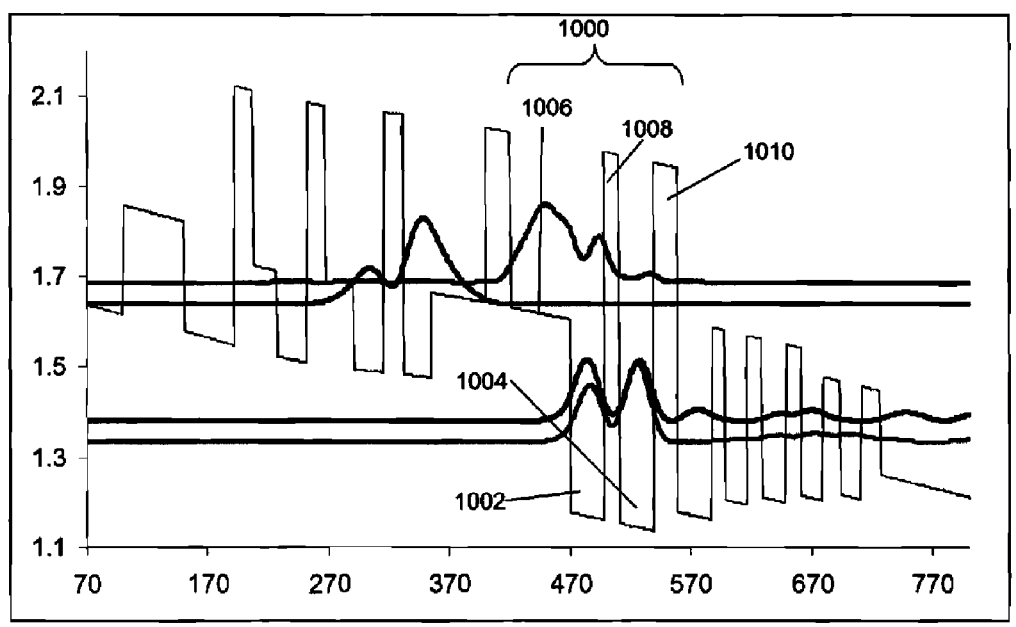
FIG. 10(a) shows the conduction band energy diagram for a multilayer structure for a laser stage having an active region with deep quantum wells that includes semiconductor well layers having a high indium content.
FIG. 10(b) is a simplified cross-sectional view through the multilayer structure of FIG. 10(a).

FIGS. 10(a) and (b) show the conduction band energy diagram and a simplified cross-sectional view of a device that includes an active region 1000 that includes two deep quantum wells made from high indium content well layers 1002, 1004. Well layer 1002 is disposed between well layer 1006 and barrier layer 1008. Well layer 1004 is disposed between barrier layer 1008 and barrier layer 1010. The optical-confinement layers, cladding layers and substrate may, be as shown in FIG. 1.

Figure 11:
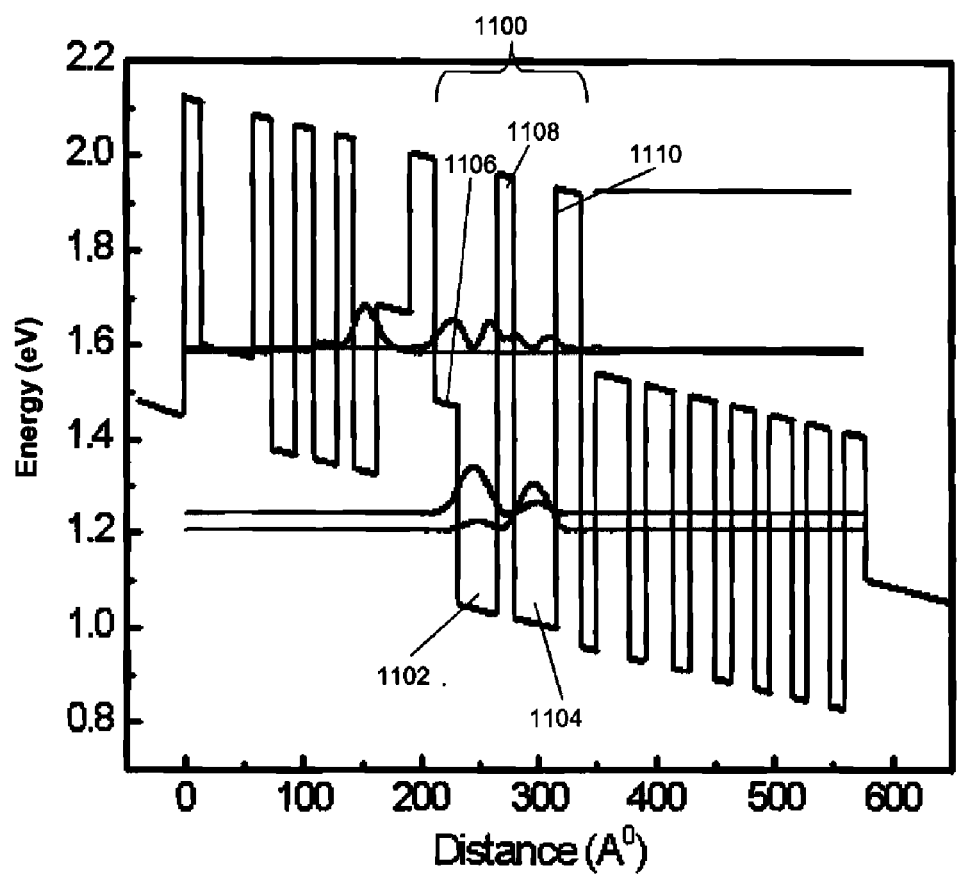
FIG. 11(a) shows the conduction band energy diagram for a multilayer structure for a laser stage having an active region with deep quantum wells that includes semiconductor well layers comprising a nitrogen-containing semiconductor.
FIG. 11(b) is a simplified cross-sectional view through the multilayer structure of FIG. 11(a).

FIGS. 11(a) and (b) show the conduction band energy diagram and a simplified cross-sectional view of a device that includes an active region 1100 that includes two deep quantum wells made from well layers 1102, 1104 comprising nitrogen-containing semiconductors (InGaAsN). Well layer 1102 is disposed between well layer 1106 and barrier layer 1108. Well layer 1104 is disposed between barrier layer 1108 and barrier layer 1110. The optical-confinement layers, cladding layers and substrate may be as shown in FIG. 1.

As shown in FIG. 1, the plurality of adjacent laser stages, which define a "laser core" 56 may be formed between a GaAs upper optical-confinement layer 27 and a GaAs lower optical-confinement layer 28. (For purposes of simplicity, only three of the laser stages 30, 58, 60 are shown in FIG. 1) An upper cladding layer 24 of GaAs may be formed over the upper confinement layer 27 and a lower cladding layer 25 of GaAs may be formed between a GaAs substrate 23 and the lower confinement layer 28. Current confinement is provided by contact metal stripes (e.g., 8 μm wide) as a top electrode 21, and a bottom electrode 22 may be formed on the bottom face of the substrate 23 so that current can flow between the electrodes transversely through the device.

Figure 8:
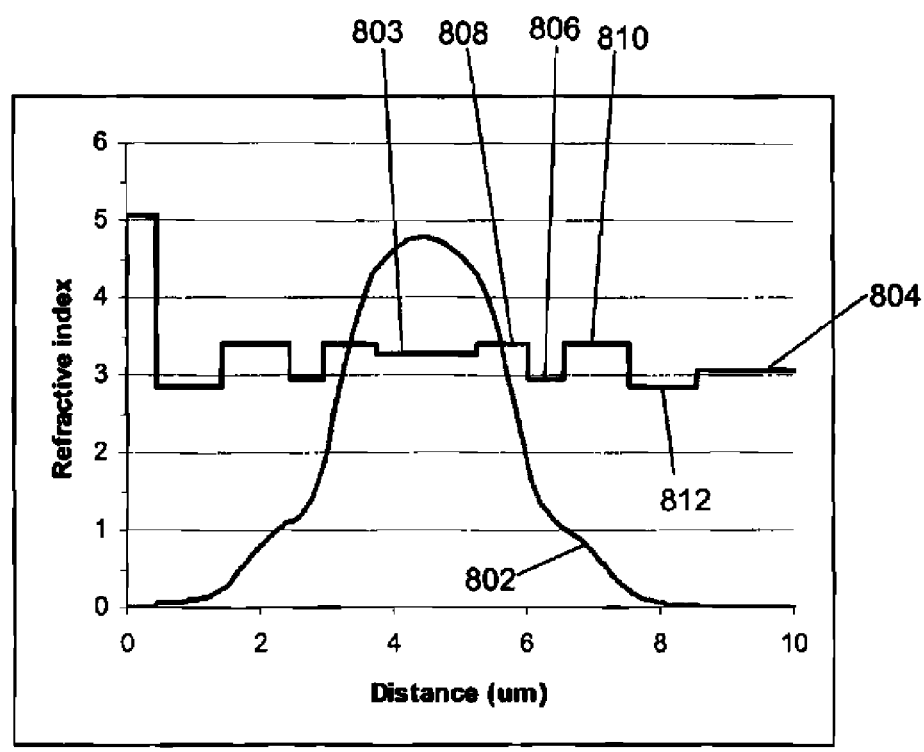
FIG. 8 shows the optical intensity profile and refractive index profile for a transverse waveguide for a quantum cascade laser in accordance with the present invention.

FIG. 8 shows the optical intensity profile 802 and refractive index profile 804 for an alternative waveguide structure. This waveguide, which surrounds an active laser core 803, includes an $Al_{0.9}Ga_{0.1}As$ layer 806 sandwiched between two lightly n-type (Si) doped ($4 \times 10^{16}$ cm$^{-3}$) GaAs layers 808 and 810. An outer layer of heavily Si doped ($5 \times 10^{18}$ cm$^{-3}$) GaAs n$^{++}$ 812 completes the optical confinement. For purposes of illustration, the thicknesses of layers 806, 808, 810 and 812 are approximately 0.5 μm, 0.8 μm, 1 μm and 1 μm, respectively. A thicker high aluminum-content cladding layer tends to improve the confinement, however, this material also has poor conductivity. Therefore, in order to minimize resistance, the cladding layer should not be too thick and should be moderately doped. In some preferred embodiments, the $Al_{0.9}Ga_{0.1}As$ layer has a thickness of about 0.3 to about 0.8 μm and it is doped about $5 \times 10^{17}$ to $10^{18}$ cm$^{-3}$.

Figure 9:
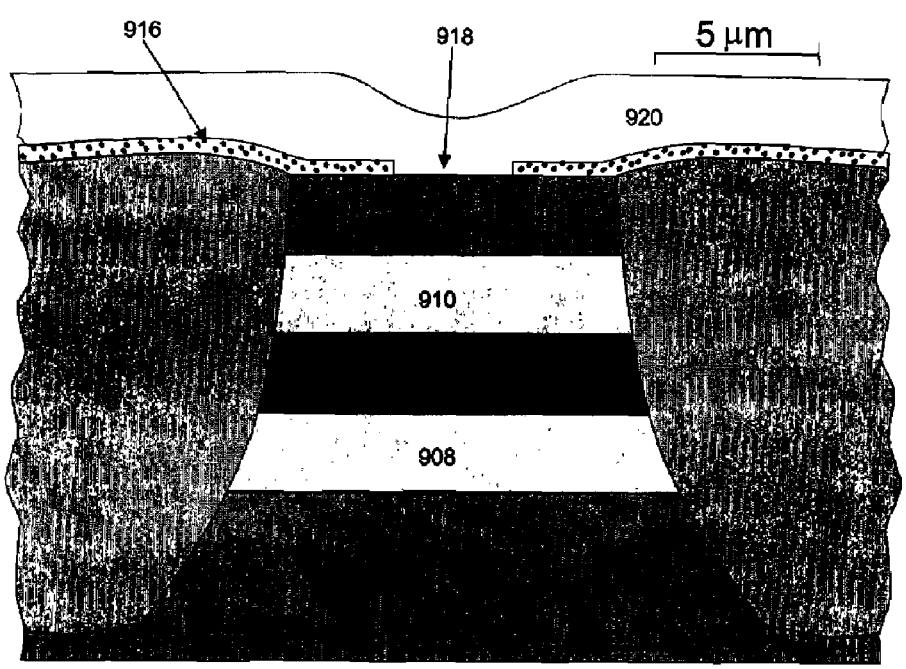
FIG. 9 shows a cross-section view through a buried heterostructure semiconductor laser in accordance with the present invention.

Another aspect of the invention provides a buried heterostructure semiconductor laser. These lasers are grown on GaAs substrates and use semi-insulating AlGaAs as a burying material. This laser includes a laser core comprising at least one laser stage having an active region containing at least one quantum well. The laser core is sandwiched between upper and lower optical-confinement layers. The upper and lower optical-confinement layers are themselves sandwiched between upper and lower cladding layers. Suitable substrates, cladding layers, confinement layers and active regions are described herein. In one illustrative embodiment, shown in FIG. 9, the substrate 902 and cladding layers 904, 906 comprise n$^+$-GaAs layers and the confinement layers 908, 910 comprise n$^-$-GaAs layers. The laser transverse waveguide can also be as shown in FIG. 8. The active region 912 includes at least one laser stage having at least one quantum well. In some embodiments, the laser core include a plurality of coupled active stages, such that the semiconductor laser is a quantum cascade laser. Suitable laser stages are described at length herein. After the semiconductor laser structure is grown on a GaAs substrate, the laser structure is etched as a mesa ridge waveguide. This may be done using a conventional etching process with dielectric masks. The waveguide is then covered with a layer of $SiO_2$ to prevent AlGaAs growth on top of the upper cladding layer. Layers of semi-insulating $Al_{0.95}Ga_{0.05}As$ 914 and 915 are then grown on either side of the waveguide to provide a buried heterostructure. The SiO$_2$ layer is then removed and a thin insulating layer of Si$_3$N$_4$ 916, defining aperture 918, is deposited (e.g., evaporated) over upper cladding layer 906. Alternatively the high Al-content Al$_x$Ga$_{1-x}$As grown material can also be partially and controllably removed through a simple etch process using aqueous HCl or HF, which will stop at the GaAs-topped buried ridges. Finally, a layer of metal 920 is deposited over insulating material 916 and upper cladding layer 906. This buried heterostructure significantly improves heat removal from the laser core and reduces lateral waveguide losses.

The semiconductor structures represented in the figures may be produced by conventional semiconductor processing techniques, and do not require the use of molecular beam epitaxy for crystal growth. For example, by utilizing a state-of-the-art MOCVD reactor, high-quality semiconductor multi layers can be fabricated.

Various semiconductor material systems may be utilized in the present invention. In general, GaAs-based structures grown on GaAs substrates are preferred. Nonetheless, the invention maw, be implemented using the InP-based material system as well as others.

It is understood that the invention is not confined to the particular embodiments set forth herein as illustrative, but embraces all such modified forms thereof as come within the scope of the following claims.

What is claimed is:

1. A semiconductor laser comprising a plurality of coupled laser stages, each stage comprising a multiple semiconductor layer structure including an electron injector, an active region coupled to the electron injector and an electron reflector coupled to the active region opposite the electron injector, wherein:
   (a) the electron injector has an upper miniband, a lower miniband, and a minigap;
   (b) the active region comprises at least one quantum well having associated therewith an upper energy level and a lower energy level, characterized in that electrons injected into the upper energy level of the active region from the lower miniband of the electron injector undergo a radiative transition to emit a photon as they decay from the upper energy level to the lower energy level; and
   (c) the electron reflector comprises an upper miniband, a lower minband, and a minigap, characterized in that the minigap acts as a reflector for electrons in the upper energy level of the active region and the lower miniband acts as a transmitter of the electrons that have decayed to the lower energy level of the active region to the lower miniband of the injector in the adjacent laser stage;
   wherein the electron injectors and electron reflectors between active regions are of different structure.

2. The semiconductor laser of claim 1, wherein the semiconductor laser comprises at least ten coupled laser stages.

3. The semiconductor laser of claim 1, wherein the active region comprises at least two coupled quantum wells.

4. The semiconductor laser of claim 3, wherein the at least two coupled quantum wells of the active region are deep quantum wells.

5. The semiconductor laser of claim 4, wherein the quantum wells comprise layers of InGaAs separated by barrier layers of AlGaAs.

6. The semiconductor laser of claim 1, wherein the active region comprises at least three coupled quantum wells.

7. The semiconductor laser of claim 6, wherein two quantum wells of the at least three coupled quantum wells of the active region are deep quantum wells.

8. The semiconductor laser of claim 7, wherein the at least three quantum wells comprise a well layer of GaAs and two well layers of InGaAs separated by barrier layers of AlGaAs.

9. The semiconductor laser of claim 6, wherein the at least three coupled quantum wells of the active region are deep quantum wells.

10. The semiconductor laser of claim 9, wherein one of the at least three quantum wells comprise a composite quantum well comprising a layer of GaAsP and a layer of InGaAs and the other two quantum wells comprise layers of InGaAs separated by barrier layers of AlGaAs.

11. The semiconductor laser of claim 1, wherein the electron injector is a superlattice comprising alternating layers of GaAs and AlGaAs, the active region comprises alternating layers of InGaAs and AlGaAs and the electron reflector is a superlattice comprising alternating layers of InGaAs and GaAsP.

12. The semiconductor laser of claim 1, wherein the combined length of the electron reflector of a first laser stage and the coupled electron injector of a second laser stage is at least about 40 nm.

13. The semiconductor laser of claim 1, wherein the plurality of coupled laser stages provide a laser core, the semiconductor laser further comprising a first optical confinement layer and a first cladding layer disposed above the laser core and a second optical confinement layer and a second cladding layer disposed below the laser core.

14. The semiconductor laser of claim 13, further comprising a substrate disposed below the second cladding layer.

15. The semiconductor laser of claim 14, wherein the first optical confinement layer, the first cladding layer, the second optical confinement layer, the second cladding layer and the substrate comprise n-type GaAs.

16. The semiconductor laser of claim 14, wherein the first optical confinement layer, the second optical confinement layer, and the substrate comprise n-type GaAs, and the first cladding layer and the second cladding layer comprise n-type AlGaAs.

17. The semiconductor laser of claim 1, wherein the photons emitted in the radiative transition have a wavelength of at least 3 μm.

18. The semiconductor laser of claim 1, wherein the photons emitted in the radiative transition have a wavelength of at least 6 μm.

19. The semiconductor laser of claim 1, wherein the at least one quantum well in the active region is a deep quantum well comprising a semiconductor well layer comprising at least 30 atomic percent indium.

20. The semiconductor laser of claim 19, wherein the semiconductor well layer comprises about 50 to about 60 atomic percent indium.

21. The semiconductor laser of claim 19, wherein the semiconductor well layer is a layer of InGaAs.

22. The semiconductor laser of claim 21, wherein the at least one deep quantum well comprises a layer of InGaAs sandwiched between two layers of AlGaAs.

23. The semiconductor laser of claim 21, wherein the at least one deep quantum well comprises a layer of InGaAs sandwiched between two layers of GaAsP.

24. The semiconductor laser of claim 22, wherein the electron reflector comprises alternating layers of AlGaAs and GaAsN or alternating layers of GaAsP and InGaAs.

25. The semiconductor laser of claim 23, wherein the electron reflector comprises alternating layers of AlGaAs and GaAsN or alternating layers of GaAsP and InGaAs.

26. The semiconductor laser of claim 1, wherein the at least one quantum well in the active region is a deep quantum well comprising a nitrogen-containing semiconductor.

27. The semiconductor laser of claim 26, wherein the nitrogen-containing semiconductor is InGaAsN.

28. The semiconductor laser of claim 27, wherein the at least one deep quantum well comprises a layer of InGaAsN sandwiched between two barrier layers of AlGaAs or a layer of InGaAsN sandwiched between two barrier layers of GaAsP.

29. The semiconductor laser of claim 26, further comprising an electron reflector adjacent to and down-stream from the active region, the electron reflector comprising alternating layers of AlGaAs and GaAsN.

* * * * *

UNITED STATES PATENT AND TRADEMARK OFFICE
CERTIFICATE OF CORRECTION

PATENT NO.         : 7,403,552 B2
APPLICATION NO.    : 11/276712
DATED              : July 22, 2008
INVENTOR(S)        : Dan Botez, Dapeng P. Xu and Luke J. Mawst It is certified that error appears in the above-identified patent and that said Letters Patent is hereby corrected as shown below:

TITLE PAGE; UNDER OTHER PUBLICATIONS:

Col. 1, page 3, Choquette reference:

Delete "Oxidatikon" and replace with --Oxidation--.

Col. 1, page 4, Schlenker reference:

Delete "1-17" and replace with --1.17--.

Col. 1, page 4, Stintz reference:

Delete "Stinz" and replace with --Stintz--.

Col. 2, page 4, Tansu reference: Line 59, 60;

Delete "Jan. 2002" and replace with --June 2002--.

IN THE SPECIFICATION:

Col. 4, Line 30:

Delete the phrase "improved toweling efficiency" and replace with --improved tunneling efficiency--.

UNITED STATES PATENT AND TRADEMARK OFFICE
CERTIFICATE OF CORRECTION

PATENT NO.         : 7,403,552 B2
APPLICATION NO. : 11/276712
DATED                 : July 22, 2008
INVENTOR(S)      : Dan Botez, Dapeng P. Xu and Luke J. Mawst It is certified that error appears in the above-identified patent and that said Letters Patent is hereby corrected as shown below:

Col. 4, Line 43:

Delete "wvaveguiding" and replace with --waveguiding--.

Col. 6, Line 47:

Delete "38, 547" and replace with --38, 54--.

Col. 7, Line 16:

Delete "FIG. 21" and replace with --FIG. 2--.

Col. 9, Line 18:

Delete "anon-radiative" and replace with --a non-radiative--.

Signed and Sealed this

Seventeenth Day of February, 2009

JOHN DOLL
*Acting Director of the United States Patent and Trademark Office*